(12) United States Patent
Sano

(10) Patent No.: US 10,075,608 B2
(45) Date of Patent: *Sep. 11, 2018

(54) IMAGE READING APPARATUS AND SEMICONDUCTOR DEVICE

(71) Applicant: Seiko Epson Corporation, Tokyo (JP)

(72) Inventor: Takafumi Sano, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/602,624

(22) Filed: May 23, 2017

(65) Prior Publication Data

US 2017/0374226 A1    Dec. 28, 2017

(30) Foreign Application Priority Data

Jun. 28, 2016  (JP) .................................. 2016-127772

(51) Int. Cl.
*H04N 1/04* (2006.01)
*H04N 1/193* (2006.01)
(Continued)

(52) U.S. Cl.
CPC ..... *H04N 1/1931* (2013.01); *H01L 27/14612* (2013.01); *H04N 1/03* (2013.01)

(58) Field of Classification Search
CPC .......... H04N 5/378; H04N 5/363; H04N 5/32; H04N 5/355; H04N 5/357; H04N 5/37455; H04N 5/3355; H04N 5/3535; H04N 5/3742; H04N 9/045; H04N 3/155; H04N 5/343; H04N 5/347; H04N 5/35563; H04N 5/3559; H04N 5/3575; H04N 5/3745; H04N 5/37452; H04N 1/03; H04N 1/1931; H04N 5/341; H04N 5/35572; H04N 5/3696;
(Continued)

(56) References Cited

U.S. PATENT DOCUMENTS 4,729,038 A    3/1988  Miura et al.
4,763,241 A    8/1988  Egawa et al.
(Continued)

FOREIGN PATENT DOCUMENTS

JP    05-207375 A    8/1993
JP    2014-216795 A    11/2014
JP    2015-046761 A    3/2015

*Primary Examiner* — Negussie Worku
(74) *Attorney, Agent, or Firm* — Harness, Dickey & Pierce, P.L.C.

(57) ABSTRACT

An image reading apparatus which reads an image includes a first pixel that includes a first light receiving element which performs photoelectric conversion; a second pixel that includes a second light receiving element which performs photoelectric conversion; a first reading circuit that includes a first capacitor which is electrically connected to the first pixel and a first amplifier having an input terminal which is electrically connected to the first capacitor; a second reading circuit that includes a second capacitor which is electrically connected to the second pixel, a second amplifier, and a first switch which switches whether or not to electrically connect the second capacitor to an input terminal of the second amplifier; and a second switch that switches whether or not to electrically connect a first node between the first capacitor and the first amplifier to a second node between the second capacitor and the second amplifier.

6 Claims, 11 Drawing Sheets

(51) Int. Cl.
*H04N 1/03* (2006.01)
*H01L 27/146* (2006.01)

(58) Field of Classification Search
CPC .. H04N 5/374; H04N 5/37457; G06F 3/0304; G06F 30/42; G06F 3/04883
USPC .......... 348/308, E5.091, 300, 302, 294, 301, 348/311; 358/482; 250/208.1, 214 A, 250/370.09
See application file for complete search history.

(56) References Cited

U.S. PATENT DOCUMENTS

| | | |
|---|---|---|
| 5,322,994 A | 6/1994 | Uno |
| 9,713,922 B2 * | 7/2017 | Sano .................... B41J 2/04541 |
| 2003/0193585 A1 * | 10/2003 | Ogura .................... H04N 9/045 |
| | | 348/272 |
| 2008/0239106 A1 * | 10/2008 | Sano .................... H03M 1/0695 |
| | | 348/241 |
| 2009/0086084 A1 * | 4/2009 | Komaba ................ G03B 13/18 |
| | | 348/349 |
| 2010/0238334 A1 | 9/2010 | Takahashi |
| 2014/0320720 A1 | 10/2014 | Ohshitanai |
| 2015/0062394 A1 | 3/2015 | Ikeda et al. |
| 2016/0159088 A1 * | 6/2016 | Sano .................... B41J 2/04541 |
| | | 347/68 |
| 2016/0167368 A1 | 6/2016 | Sano |
| 2016/0167371 A1 | 6/2016 | Sano |
| 2016/0221331 A1 * | 8/2016 | Sano .................... B41J 2/04541 |
| 2017/0070691 A1 | 3/2017 | Nishikido |
| 2017/0171419 A1 * | 6/2017 | Sano .................... H04N 1/02835 |
| 2017/0171478 A1 * | 6/2017 | Sano ........................ H04N 1/031 |
| 2017/0229503 A1 | 8/2017 | Suzuki et al. |
| 2018/0091692 A1 * | 3/2018 | Sano .................... H04N 1/1931 |

\* cited by examiner

FIG. 3
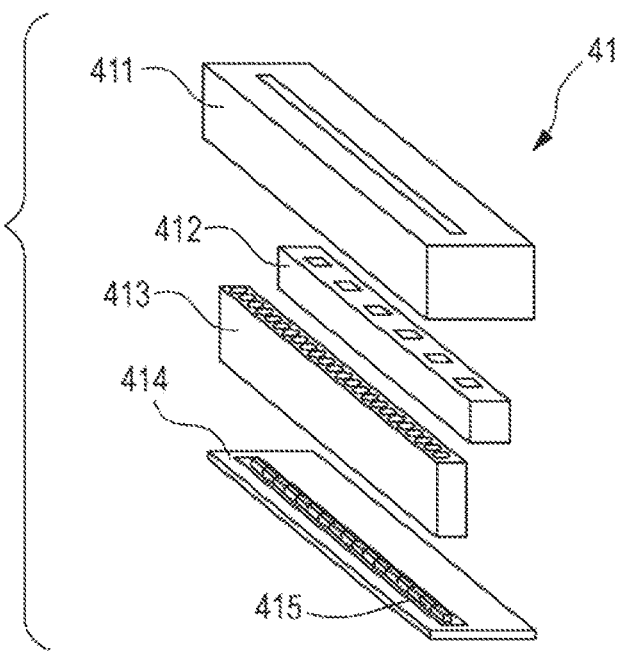
FIG. 4
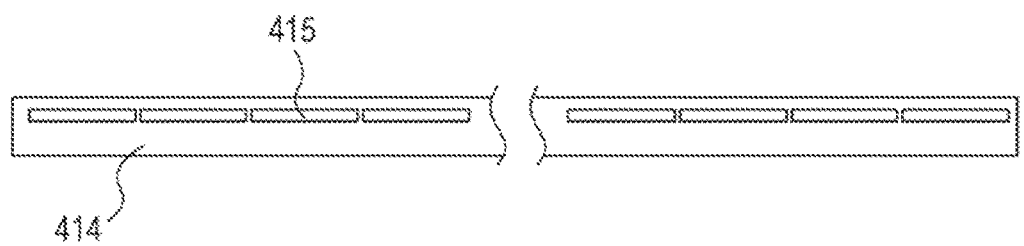
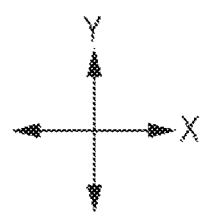

| RESOLUTION | ADD1 | ADD2 | ADD3 |
|---|---|---|---|
| 1200 dpi (NO COMBINATION OF PIXELS) | L | L | L |
| 600 dpi (COMBINATION OF TWO PIXELS) | H | L | H |
| 300 dpi (COMBINATION OF FOUR PIXELS) | H | H | H |

IMAGE READING APPARATUS AND SEMICONDUCTOR DEVICE

The entire disclosure of Japanese Patent Application No. 2016-127772, filed Jun. 28, 2016 is expressly incorporated by reference herein.

BACKGROUND

1. Technical Field

The present invention relates to an image reading apparatus and a semiconductor device.

2. Related Art

An image reading apparatus (scanner) which uses a contact image sensor, a copy machine in which a print function is added to the image reading apparatus, a complex printer, or the like is developed. The contact image sensor which is used for the image reading apparatus adopts a configuration in which a photodiode provided in a semiconductor substrate is used. Generally, as the image reading apparatus (scanner) performs pixel combination of combining output signals of a plurality of pixels, a reading function of an image is realized in a plurality of resolutions.

For example, JP-A-2014-216795 discloses a solid imaging apparatus in which transfer gates are respectively disposed between a charge detection portion (floating diffusion) and two photodiodes and, if two transfer gates operate, electric charges accumulated in the two photodiodes move to the charge detection portion and a signal obtained by combining pixels is output.

However, in the solid imaging apparatus described in JP-A-2014-216795, the transfer gate is an element included in the pixel, and thus, in a case where the number of combined pixels is different from the previous number, new development of the pixel is required, and a high development cost and a long development period are required. In contrast to this, by configuring a pixel using an inverting amplifier and a transfer switch for combining the pixels, the development period can be shortened, but a leakage current is generated in the transfer switch and a detection capacitance decreases to several fF, and thus, a new problem occurs in which image quality is degraded due to the slight leakage current.

SUMMARY

An advantage of some aspects of the invention is to provide an image reading apparatus which can increase image quality of a read image by reducing influence of a leakage current of a switch for combining pixels. In addition, another advantage of some aspects of the invention is to provide a semiconductor device which can increase accuracy of an image signal which is output by reducing influence of the leakage current of the switch for combining the pixels.

The invention can be realized in the following aspects or application examples.

APPLICATION EXAMPLE 1

According to this application example, there is provided an image reading apparatus, which reads an image, including a first pixel that includes a first light receiving element which performs photoelectric conversion; a second pixel that includes a second light receiving element which performs photoelectric conversion; a first reading circuit that includes a first capacitor which is electrically connected to the first pixel and a first amplifier having an input terminal which is electrically connected to the first capacitor; a second reading circuit that includes a second capacitor which is electrically connected to the second pixel, a second amplifier, and a first switch which switches whether or not to electrically connect the second capacitor to an input terminal of the second amplifier; and a second switch that switches whether or not to electrically connect a first node between the first capacitor and the first amplifier to a second node between the second capacitor and the second amplifier.

Generally, since sensitivity of a pixel is inversely proportional to detection capacitance of the pixel, it is preferable that the detection capacitance be small (for example, several fF). Thus, in the same manner as the related art, if a transfer switch is turned on and thereby electric charges accumulated in detection capacitors of two pixels are added together (pixels are combined), the proportion of voltage components which are suppressed by a leakage current that is generated in the transfer switch can significantly increase in a signal which is obtained by the combination of pixels, and image quality of a read image can be degraded.

In contrast to this, in the image reading apparatus according to this application example, the first reading circuit in a rear stage of the first pixel or the second reading circuit in a rear stage of the second pixel is a noise removing circuit according to a ratio between the first capacitor and the second capacitor, and since constraint of an absolute value of capacitance is small, the first capacitor or the second capacitor can be fairly larger (for example, several hundred fF) than the detection capacitance (for example, several fF) of the first pixel or the second pixel. Hence, in the image reading apparatus according to this application example, first electric charges which are read from the first pixel and are accumulated in the first capacitor are added to second electric charges which are read from the second pixel and are accumulated in the second capacitor, through the first switch, and thereby, the pixels can be combined. Thus, in the image reading apparatus according to this application example, a ratio of voltage components which are suppressed by a leakage current that is generated in the first switch can significantly decrease in a signal which is obtained by the combination of pixels, and image quality of a read image can increase.

In addition, according to this application example, since a combination of pixels are performed in the outside of the first pixel or the second pixel by the first switch, in a case where an image reading apparatus having the number of combined pixels different from the previous number is developed, the number of the first switches may be increased or decreased, and thus, development of a new pixel is not required, development cost is reduced, and development period is shortened.

APPLICATION EXAMPLE 2

In the image reading apparatus according to this application example, in a case where the first switch is in an electrical disconnection state, the second switch may enter an electrical connection state, and in a case where the first switch is in an electrical connection state, the second switch may enter an electrical disconnection state.

In the image reading apparatus according to this application example, in a case where the first switch is in an electrical disconnection state and the second switch is in an electrical connection state, the first electric charges which are read from the first pixel through the first switch and are accumulated in the first capacitor are added to the second electric charges which are read from the second pixel and are accumulated in the second capacitor, and thereby, the combination of pixels are performed. In addition, in a case where the first switch is in an electrical connection state and the second switch is in an electrical disconnection state, the first electric charges which are read from the first pixel and are accumulated in the first capacitor are input to a first amplifier to be amplified, and the second electric charges which are read from the second pixel and are accumulated in the second capacitor are input to the first amplifier through a second switch to be amplified, and thereby, the combination of pixel is not performed. That is, in the image reading apparatus according to this application example, by selecting whether or not to perform the combination of pixels, resolution of a read image can be changed.

APPLICATION EXAMPLE 3

In the image reading apparatus according to this application example, in a case where the first switch is in an electrical disconnection state and the second switch is in an electrical connection state, an operation of the second reading circuit may stop.

In the image reading apparatus according to this application example, in a case where the first switch is in an electrical disconnection state and the second switch is in an electrical connection state, that is, in a case where a combination of pixels is performed, a signal which is obtained by the combination of pixels is output from the first amplifier (first reading circuit), and thus, the second reading circuit is not required to operate. Accordingly, an operation of the second reading circuit stops and thus, power consumption is reduced.

APPLICATION EXAMPLE 4

In the image reading apparatus according to this application example, the first reading circuit may electrically connect the first capacitor and the first amplifier, and may further include a third switch in an electrical connection state.

In the image reading apparatus according to this application example, in a case where the first switch is in an electrical connection state and the second switch is in an electrical disconnection state, that is, in a case where a combination of pixels is not performed, the first electric charges which are read from the first pixel and are accumulated in the first capacitor are input to the first amplifier through the third switch to be amplified, and the second electric charges which are read from the second pixel and are accumulated in the second capacitor are input to the first amplifier through the second switch to be amplified. Thus, in the image reading apparatus according to this application example, a difference of a configuration between the first reading circuit and the second reading circuit is reduced by including the third switch in a case where the combination of pixels is not performed. As a result, a difference of characteristics between an output signal of the first reading circuit and an output signal of the second reading circuit is reduced, and thus, it is possible to increase image quality of a read image.

APPLICATION EXAMPLE 5

In the image reading apparatus according to this application example, the first pixel may include a first inverting amplifier that is electrically connected to the first light receiving element; a fourth switch that is electrically connected to both terminals of the first inverting amplifier; and a third capacitor that is electrically connected to both terminals of the first inverting amplifier, and the second pixel may include a second inverting amplifier that is electrically connected to the second light receiving element; a fifth switch that is electrically connected to both terminals of the second inverting amplifier; and a fourth capacitor that is electrically connected to both terminals of the second inverting amplifier.

In the image reading apparatus according to this application example, the first pixel or the second pixel is not a pixel which transfers electric charges generated by photoelectric conversion of a light receiving element by using a transfer gate, but is a pixel which uses the inverting amplifier, in the same manner as the related art, and thus, in order for each of the first pixel to perform the combination of pixels, the transfer switch is required, but a leakage current of the transfer switch tends to be larger than the leakage of the transfer gate in the related art. However, in the image reading apparatus according to this application example, the combination of pixels is performed in the first reading circuit, and thus, the transfer switch need not be provided in the first pixel and the leakage current is hard to increase.

APPLICATION EXAMPLE 6

According to this application example, there is provided a semiconductor device including a first pixel that includes a first light receiving element which performs photoelectric conversion; a second pixel that includes a second light receiving element which performs photoelectric conversion; a first reading circuit that includes a first capacitor which is electrically connected to the first pixel and a first amplifier having an input terminal which is electrically connected to the first capacitor; a second reading circuit that includes a second capacitor which is electrically connected to the second pixel, a second amplifier having an input terminal which is electrically connected to the second capacitor, and a first switch which switches whether or not to electrically connect the second capacitor to the second amplifier; and a second switch that switches whether or not to electrically connect a first node between the first capacitor and the first amplifier to a second node between the second capacitor and the second amplifier.

In the semiconductor device according to this application example, the first reading circuit in a rear stage of the first pixel or the second reading circuit in a rear stage of the second pixel is a noise removing circuit according to a ratio between the first capacitor and the second capacitor, and since constraint of an absolute value of capacitance is small, the first capacitor or the second capacitor can be fairly larger (for example, several hundred fF) than the detection capacitance (for example, several fF) of the first pixel or the second pixel. Hence, in the semiconductor device according to this application example, first electric charges which are read from the first pixel and are accumulated in the first capacitor are added to second electric charges which are read from the second pixel and are accumulated in the second capacitor, and thereby, the pixels can be combined. Thus, in the semiconductor device according to this application example, a ratio of voltage components which are suppressed by a leakage current that is generated in the first switch can significantly decrease in a signal which is obtained by the combination of pixels, and image quality of a read image can increase.

In addition, according to this application example, since a combination of pixels are performed in the outside of the first pixel or the second pixel by the first switch, in a case where a semiconductor device having the number of combined pixels different from the previous number is developed, the number of the first switches may be increased or decreased, and thus, development of a new pixel is not required, development cost is reduced, and development period is shortened.

BRIEF DESCRIPTION OF THE DRAWINGS

The invention will be described with reference to the accompanying drawings, wherein like numbers reference like elements.

FIG. 3 is an exploded perspective view schematically illustrating a configuration of an image sensor module.

FIG. 4 is a plan view schematically illustrating arrangement of image reading chips.

DESCRIPTION OF EXEMPLARY EMBODIMENTS

Hereinafter, appropriate embodiments of the invention will be described in detail by using the drawings. The drawings which are used are for the sake of convenience of description. The embodiments which will be described below are not intended to unduly limit content of the invention described in the scope of claims. In addition, all the configurations which will be described below are not necessarily essential components of the invention.

Hereinafter, a complexer (complex device) 1 applied to an image reading apparatus according to the present embodiment will be described with reference to the accompanying drawings.

1. First Embodiment 1-1. Structure of Complexer

Figure 1:
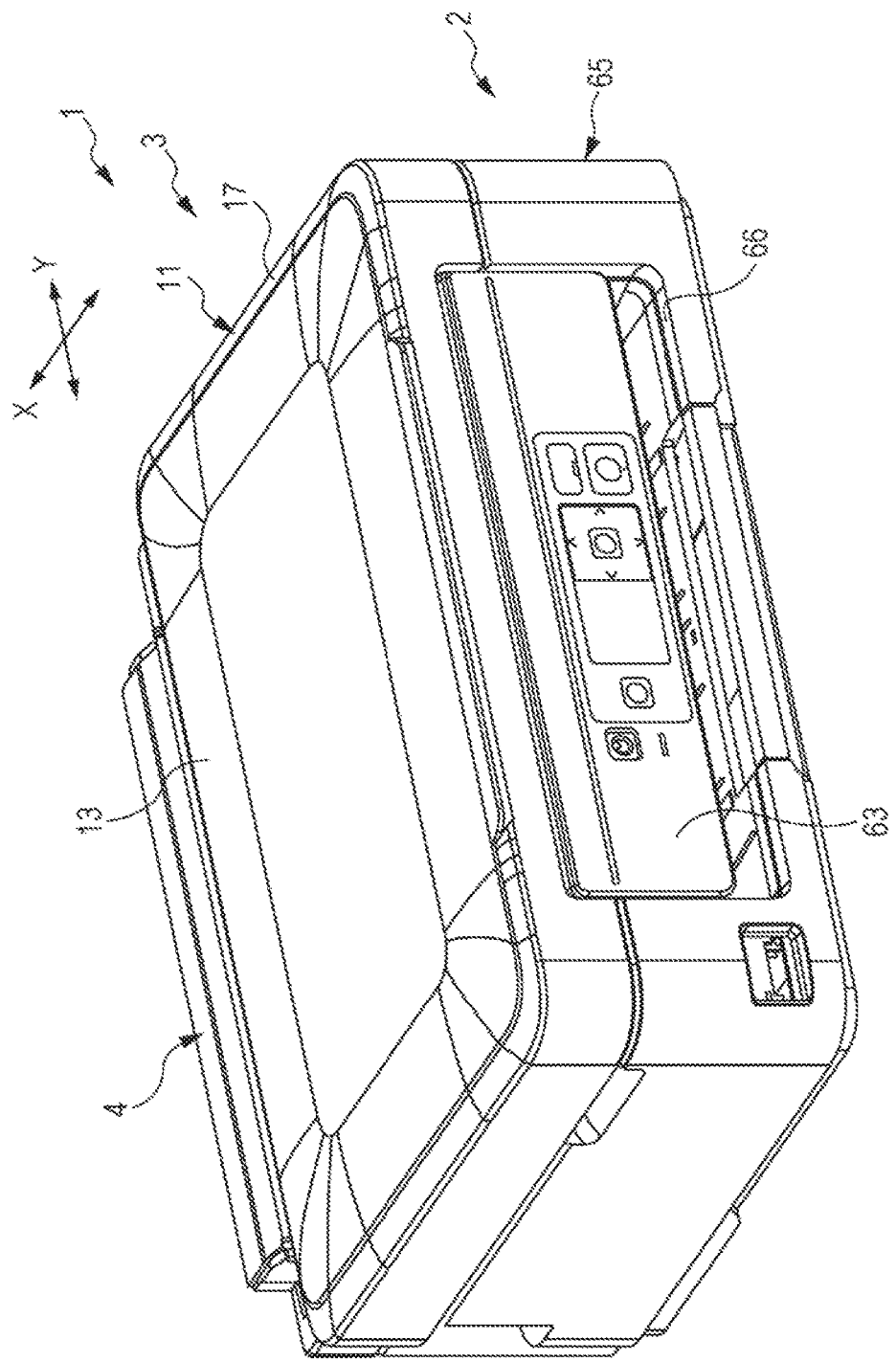
FIG. 1 is an external perspective view illustrating a complexer according to the present embodiment.

FIG. 1 is an external perspective view illustrating the complexer 1. As illustrated in FIG. 1, the complexer 1 includes a printer unit (image recording device) 2 which is a device body, and a scanner unit (image reading apparatus) 3 that is an upper unit disposed in an upper portion of the printer unit 2, as one piece. Hereinafter, description will be made by setting a front-back direction as an X-axis direction and a left-right direction as a Y-axis direction, in FIG. 1.

Meanwhile, as illustrated in FIG. 1, the printer unit 2 includes a transport unit (not illustrated) which feeds a recording medium of sheet (print paper or cut paper) along a feeding path, a print unit (not illustrated) which is disposed on an upper portion of the feeding path and performs print processing on the recording medium by using an ink jet method, an operation unit 63 of a panel type which is disposed on a front surface, another transport unit, a device frame (not illustrated) in which the printer unit and the operation unit 63 are mounted, and a device housing which covers those. An outlet 66 through which the recording medium whose printing is completed is discharged is provided in the device housing 65. In addition, a USB port and a power port, which are not illustrated, are disposed in a lower portion of a rear surface. That is, the complexer 1 is configured to be able to be connected to a computer or the like through the USB port.

The scanner unit 3 is rotatably supported to the printer unit 2 through a the hinge unit 4 of a rear end portion, and covers an upper portion of the printer unit 2 to be freely opened and closed. That is, by pulling up the scanner unit 3 in a rotation direction, an opening of an upper surface of the printer unit 2 is exposed, and an internal portion of the printer unit 2 is exposed through the opening of the upper portion. Meanwhile, by pulling down the scanner unit 3 in the rotation direction to mount on the printer unit 2, the opening of the upper portion is closed by the scanner unit 3. As such, by opening the scanner unit 3, it is possible to provide a configuration for replacing an ink cartridge, solving paper jam, and the like.

Figure 2:
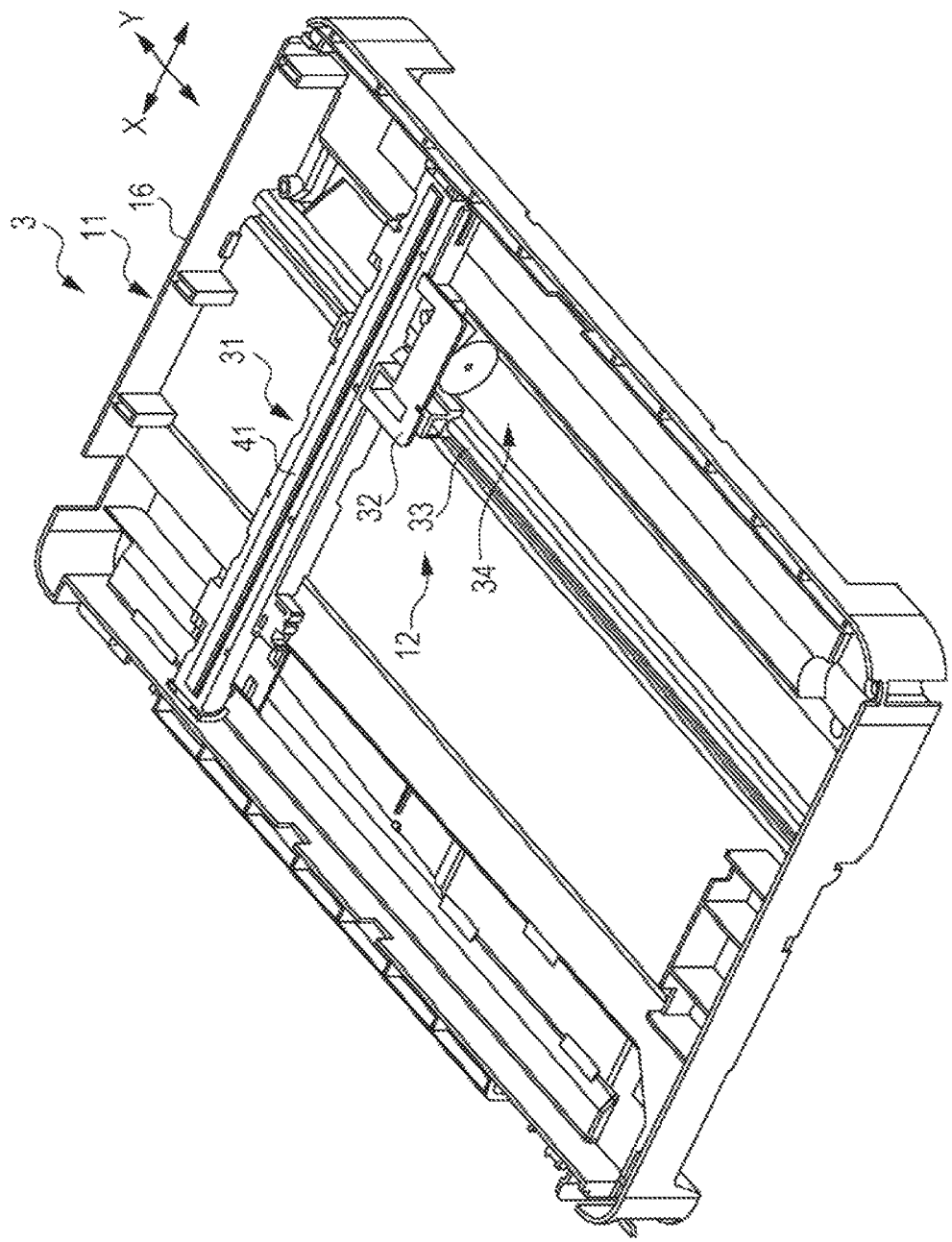
FIG. 2 is a perspective view illustrating an internal structure of a scanner unit.

FIG. 2 is a perspective view illustrating an internal structure of the scanner unit 3. As illustrated in FIGS. 1 and 2, the scanner unit 3 includes an upper frame 11 which is a housing, an image reading unit 12 accommodated in the upper frame 11, an upper cover 13 rotatably supported to an upper portion of the upper frame 11. As illustrated in FIG. 2, the upper frame 11 includes a box-shaped lower case 16 which accommodates the image reading unit 12, and an upper case 17 which covers a top surface of the lower case 16. A document mounting plate (document table: not illustrated) made of glass is widely disposed on the upper case 17, and a medium to be read (document) with a surface to be read facing down is mounted thereon. Meanwhile, the lower case 16 is formed in a shallow box shape with an open upper surface.

As illustrated in FIG. 2, the image reading unit 12 includes a sensor unit 31 of a line sensor type, a sensor carriage 32 on which the sensor unit 31 is mounted, a guide shaft 33 which extend in the Y-axis direction and slidably supports the sensor carriage 32, and a self-propelled sensor moving mechanism 34 which moves the sensor carriage 32 along the guide shaft 33. The sensor unit 31 includes an image sensor module 41 which is a complementary metal-oxide-semiconductor (CMOS) line sensor extending in the X-axis direction, and performs reciprocation by the motor-driven sensor moving mechanism 34 along the guide shaft 33 in the Y-axis direction. Thereby, an image of the medium to be read (document) on the document mounting plate is read. The sensor unit 31 may be a charge coupled device (CCD) line sensor.

FIG. 3 is an exploded perspective view schematically illustrating a configuration of the image sensor module 41. In an example illustrated in FIG. 3, the image sensor module 41 is configured to include a case 411, a light source 412, a lens 413, a module substrate 414, and an image reading chip 415 (semiconductor device) for reading an image. The light source 412, the lens 413, and the image reading chip 415 are accommodated between the case 411 and the module substrate 414. A slit is provided in the case 411. The light source 412 includes each light emitting diode (LED) of, for example, R, G, and B, and makes each light emitting diode (red LED, green LED, and blue LED) of R, G, and B sequentially emit light while switching at high speed. The light source 412 irradiates the medium to be read with light through the slit, and the light from the medium to be read is incident on the lens 413 through the slit. The lens 413 guides the light which is incident to the image reading chip 415.

FIG. 4 is a plan view schematically illustrating arrangement of the image reading chips 415. As illustrated in FIG. 4, a plurality of the image reading chips 415 are arranged in parallel on the module substrate 414 in a one-dimensional direction (X-axis direction in FIG. 4). Each image reading chip 415 includes multiple light receiving elements which are arranged in a column (refer to FIGS. 6 and 7), and the higher density of the light receiving elements included in each image reading chip 415 is, the scanner unit 3 (image reading apparatus) with the higher resolution for reading an image can be realized. In addition, the larger the number of the image reading chips 415 is, the scanner unit 3 (image reading apparatus) which can also read the larger image can be realized.

1-2. Functional Configuration of Scanner Unit (Image Reading Apparatus)

Figure 5:
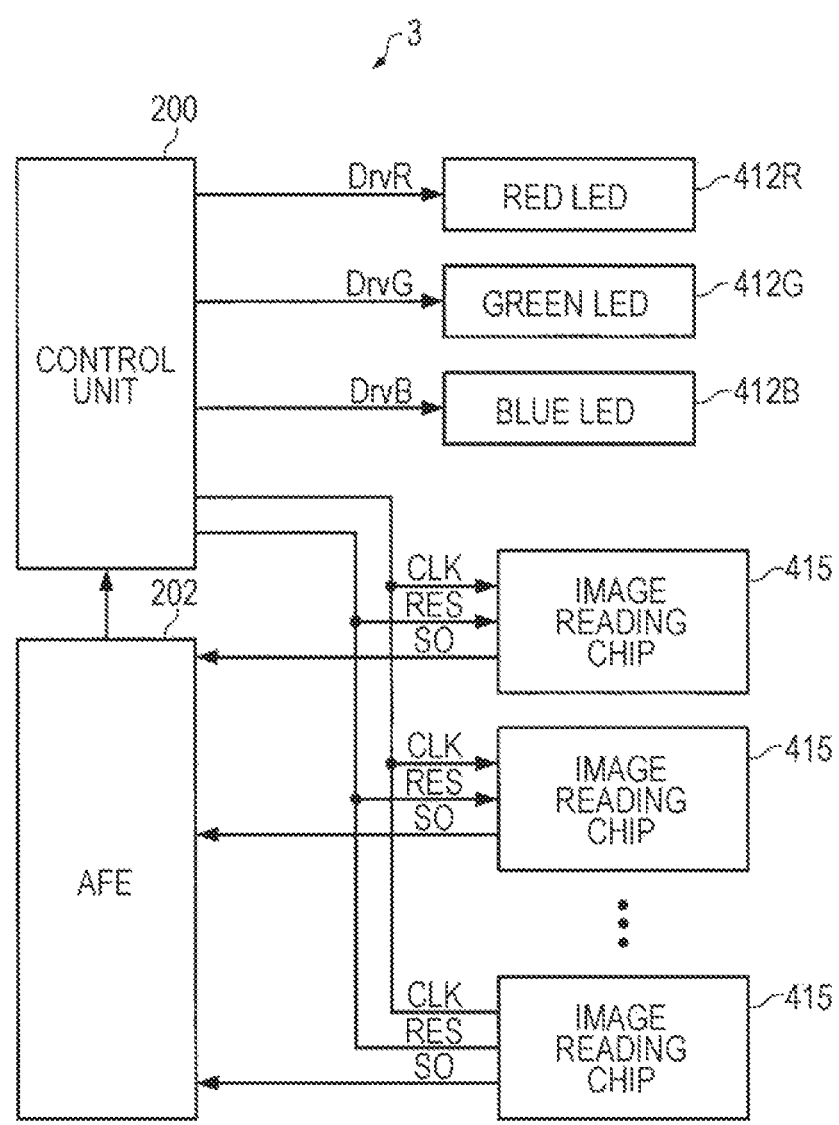
FIG. 5 is a diagram illustrating a functional configuration example of the scanner unit.

FIG. 5 is a functional block diagram illustrating a functional configuration example of the scanner unit (image reading apparatus) 3. In an example illustrated in FIG. 5, the scanner unit (image reading apparatus) 3 is configured to include a control unit 200, an analog front end (AFE) 202, a red LED 412R, a green LED 412G, a blue LED 412B, and the plurality of image reading chips 415. As described above, the red LED 412R, the green LED 412G, and the blue LED 412B are included in the light source 412, and the plurality of image reading chips 415 are arranged on the module substrate 414. Each of the red LED 412R, the green LED 412G, and the blue LED 412B may be plural. In addition, the control unit 200 and the analog front end (AFE) 202 are included in the module substrate 414 or a substrate (not illustrated) different from the module substrate 414. Each of the control unit 200 and the analog front end (AFE) 202 may be realized by an integrated circuit (IC).

When a cycle in which an image is read is referred to as T, the control unit 200 makes the red LED 412R emit light by supplying a drive signal DrvR to the red LED 412R only for a constant exposure time Δt for each 3T. In the same manner, the control unit 200 makes the green LED 412G emit light by supplying a drive signal DrvG to the green LED 412G only for the constant exposure time Δt for each 3T, and makes the blue LED 412B emit light by supplying a drive signal DrvB to the blue LED 412B only for the constant exposure time Δt for each 3T. The control unit 200 makes only one of the red LED 412R, the green LED 412G, and the blue LED 412B emit light for each cycle T.

In addition, the control unit 200 commonly supplies a clock signal CLK and a resolution setting signal RES to a plurality of image reading chips 415. The clock signal CLK is an operation clock signal of the image reading chips 415, and the resolution setting signal RES sets resolution of an image which is read by the scanner unit (image reading apparatus) 3. Hereinafter, it is assumed that resolution can be set to any one of 1200 dpi, 600 dpi, and 300 dpi by the resolution setting signal RES.

Each image reading chip 415 operates in synchronization with the clock signal CLK, and generates and outputs an image signal SO with image information of resolution set by the resolution setting signal RES, based on light that each light receiving element receives from an image formed in a medium to be read when the red LED 412R, the green LED 412G, or the blue LED 412B emits light. A detailed circuit configuration and an operation of the image reading chip 415 will be described below.

The analog front end (AFE) 202 receives a plurality of the image signals SO which are output from each image reading chip 415, performs amplification processing or A/D conversion processing for each image signal SO, converts the processed signals into digital signals having digital values corresponding to the amount of received light of each light receiving element, and sequentially transmits each digital signal to the control unit 200.

The control unit 200 receives each digital signal which is sequentially transmitted from the analog front end (AFE) 202, and generates image information that the image sensor module 41 reads.

1-3. Circuit Configuration and Operation of Image Reading Chip

Figure 6:
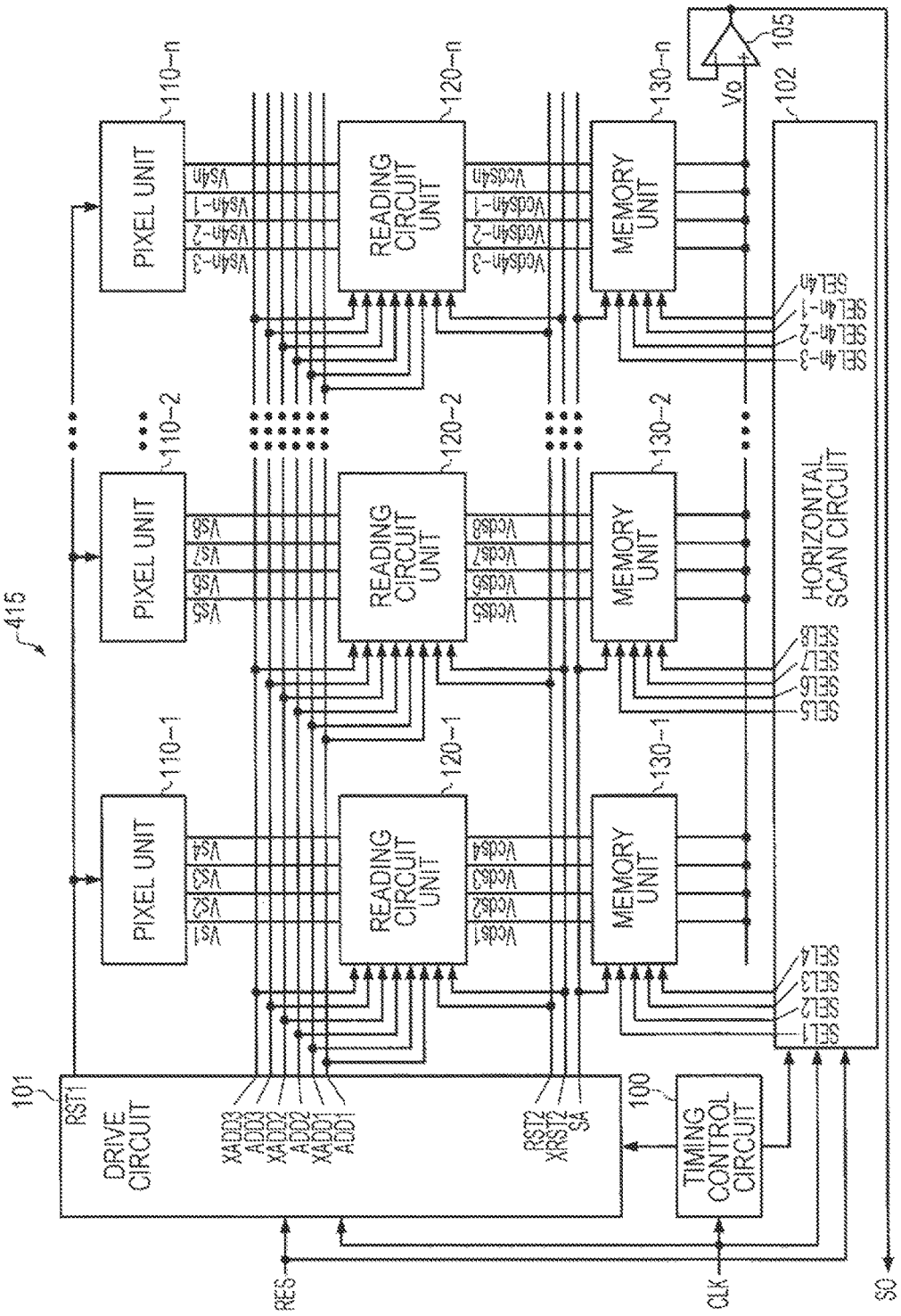
FIG. 6 is a diagram illustrating a circuit configuration example of the image reading chip.

FIG. 6 is a diagram illustrating a circuit configuration example of the image reading chip 415. The image reading chip 415 illustrated in FIG. 6 includes a timing control circuit 100, a drive circuit 101, a horizontal scan circuit 102, n pixel units 110-1 to 110-$n$, n reading circuit units 120-1 to 120-$n$, n memory units 130-1 to 130-$n$, and an operational amplifier 105.

The timing control circuit 100 counts pulses of the clock signal CLK, includes a counter (not illustrated) which initializes count values for each cycle T in which an image is read, and generates a control signal which controls an operation of the drive circuit 101 and a control signal which controls an operation of the horizontal scan circuit 102, based on an output value (count value) of the counter.

The drive circuit 101 is activated (high level in the present embodiment) for a constant time at predetermined timing before the red LED 412R, the green LED 412G, and the blue LED 412B emit light for the cycle T, and generates reset signals RST1 and RST2 synchronous to the clock signal CLK, based on the control signal from the timing control circuit 100. In addition, the drive circuit 101 generates a reset signal XRST2 which is a logical inverting signal of the reset signal RST2. The reset signal RST1 is commonly supplied to the n pixel units 110-1 to 110-$n$, and the reset signal RST2 and the reset signal XRST2 are commonly supplied to the n reading circuit units 120-1 to 120-$n$.

In addition, the drive circuit 101 generates six switch control signals ADD1, ADD2, ADD3, XADD1, XADD2, and XADD3, based on the resolution setting signal RES. The switch control signals ADD1, ADD2, ADD3, XADD1, XADD2, and XADD3 realize resolution set by the resolution setting signal RES, and go to a low level or a high level in response to the resolution setting signal RES. The switch control signals XADD1, XADD2, and XADD3 are respectively logical inverting signals of the switch control signals ADD1, ADD2, and ADD3.

In addition, the drive circuit 101 is activated (high level in the present embodiment) for a constant time at predetermined timing after the red LED 412R, the green LED 412G, and the blue LED 412B complete emission of light for the cycle T, and generates a read signal SA synchronous to the clock signal CLK, based on the control signal from the timing control circuit 100. The read signal SA is commonly supplied to the n memory units 130-1 to 130-n.

The horizontal scan circuit 102 is activated (high level in the present embodiment) for a constant time exclusively from each other at predetermined timing after the read signal SA changes from an active state (high level) to an inactive state (low level) for the cycle T, and generates 4n selection signals SEL1 to SEL(4n) synchronous to the clock signal CLK, based on the control signal from the timing control circuit 100 and the resolution setting signal RES. In a case where resolution is set to 1200 dpi by the resolution setting signal RES, the horizontal scan circuit 102 sequentially activates (high level) the 4n selection signals SEL1 to SEL(4n) one by one only for one cycle of the clock signal CLK. In addition, in a case where resolution is set to 600 dpi by the resolution setting signal RES, the horizontal scan circuit 102 sequentially activates (high level) the 2n selection signals SEL(4k-3) and SEL(4k-1) (k=1 to n) one by one only for one cycle of the clock signal CLK. In addition, in a case where resolution is set to 300 dpi by the resolution setting signal RES, the horizontal scan circuit 102 sequentially activates (high level) the n selection signals SEL(4k-3) (k=1 to n) one by one only for one cycle of the clock signal CLK.

The pixel unit 110-k (k=1 to n) includes four pixel circuits and outputs voltages (pixel voltages) Vs(4k-3), Vs(4k-2), Vs(4k-1), and Vs(4k) according to light which is emitted by the red LED 412R, the green LED 412G, and the blue LED 412B and is received from the medium to be read for the exposure time Δt, after the four pixel circuits are initialized by the reset signal RST1 from the drive circuit 101. That is, the image reading chip 415 includes 4n pixel circuits, and the 4n pixel circuits respectively pixel voltages Vs1 to Vs(4n). In the present embodiment, the exposure time Δt in a case where the resolution is set to 600 dpi is approximately half the exposure time Δt in a case where the resolution is set to 1200 dpi, and the exposure time Δt in a case where the resolution is set to 300 dpi is approximately a quarter of the exposure time Δt in a case where the resolution is set to 1200 dpi.

The reading circuit unit 120-k (k=1 to n) includes four reading circuits and outputs four read voltages Vcds(4k-3), Vcds(4k-2), Vcds(4k-1), and Vcds(4k), based on the pixel voltages Vs(4k-3), Vs(4k-2), Vs(4k-1), and Vs(4k) which are output from the pixel unit 110-k, and the switch control signals ADD1, ADD2, ADD3, XADD1, XADD2, and XADD3, after the four reading circuits are initialized by the reset signal RST2 and XRST2 from the drive circuit 101. In a case where resolution is set to 1200 dpi, the read voltages Vcds(4k-3), Vcds(4k-2), Vcds(4k-1), and Vcds(4k) are voltages obtained by inversely amplifying each potential difference (each voltage which changes as the exposure time Δt elapses) of the pixel voltages Vs(4k-3), Vs(4k-2), Vs(4k-1), and Vs(4k) before and after exposure. In addition, in a case where resolution is set to 600 dpi, the read voltage Vcds(4k-3) is a voltage obtained by adding each potential difference of the pixel voltages Vs(4k-3) and Vs(4k-2) together and inversely amplifying the added potential difference before and after exposure, and the read voltage Vcds(4k-1) is a voltage obtained by adding each potential difference of the pixel voltages Vs(4k-1) and Vs(4k) together and inversely amplifying the added potential difference before and after exposure. In addition, in a case where resolution is set to 300 dpi, the read voltage Vcds(4k-3) is a voltage obtained by adding each potential difference of the pixel voltages Vs(4k-3), Vs(4k-2), Vs(4k-1), and Vs(4k) together and inversely amplifying the added potential difference before and after exposure.

The memory unit 130-k (k=1 to n) includes four memory circuits, the four memory circuits respectively retain the read voltages Vcds(4k-3), Vcds(4k-2), Vcds(4k-1), and Vcds(4k) which are output from the reading circuit unit 120-k by the read signal SA from the drive circuit 101, and the read voltage retained in the memory circuit selected by the four selection signals SEL(4k-3), SEL(4k-2), SEL(4k-1), and SEL(4k) from the horizontal scan circuit 102 is output. The memory unit 130-k (k=1 to n) outputs the read voltage Vcds(4k-3) when the selection signal SEL(4k-3) is active (high level), outputs the read voltage Vcds(4k-2) when the selection signal SEL(4k-2) is active (high level), outputs the read voltage Vcds(4k-1) when the selection signal SEL(4k-1) is active (high level), and outputs the read voltage Vcds(4k) when the selection signal SEL(4k) is active (high level).

The operational amplifier 105 includes a non-inverting input terminal commonly connected to output terminals of the n memory units 130-1 to 130-n and an inverting input terminal connected to an output terminal thereof. The operational amplifier 105 is a voltage follower, and a voltage of an output signal is equal to a voltage of an image signal Vo which is input to the non-inverting input terminal. Hence, the output signal of the operational amplifier 105 is output from the image reading chip 415 as the image signal SO. Thus, in a case where resolution is set to 1200 dpi, a voltage of the image signal SO becomes the read voltages Vcds1 to Vcds(4n) sequentially selected by the 4n selection signals SEL1 to SEL4n during a predetermined period of the cycle T. In addition, in a case where resolution is set to 600 dpi, the voltage of the image signal SO becomes the read voltages Vcds1 to Vcds(4k-3) and Vcds(4k-2) sequentially selected by the 2n selection signals SEL(4k-3) and SEL(4k-2) (k=1 to n) during the predetermined period of the cycle T. In addition, in a case where resolution is set to 300 dpi, the voltage of the image signal SO becomes the read voltage Vcds(4k-3) sequentially selected by the n selection signals SEL(4k-3) (k=1 to n) during the predetermined period of the cycle T.

Figure 7:
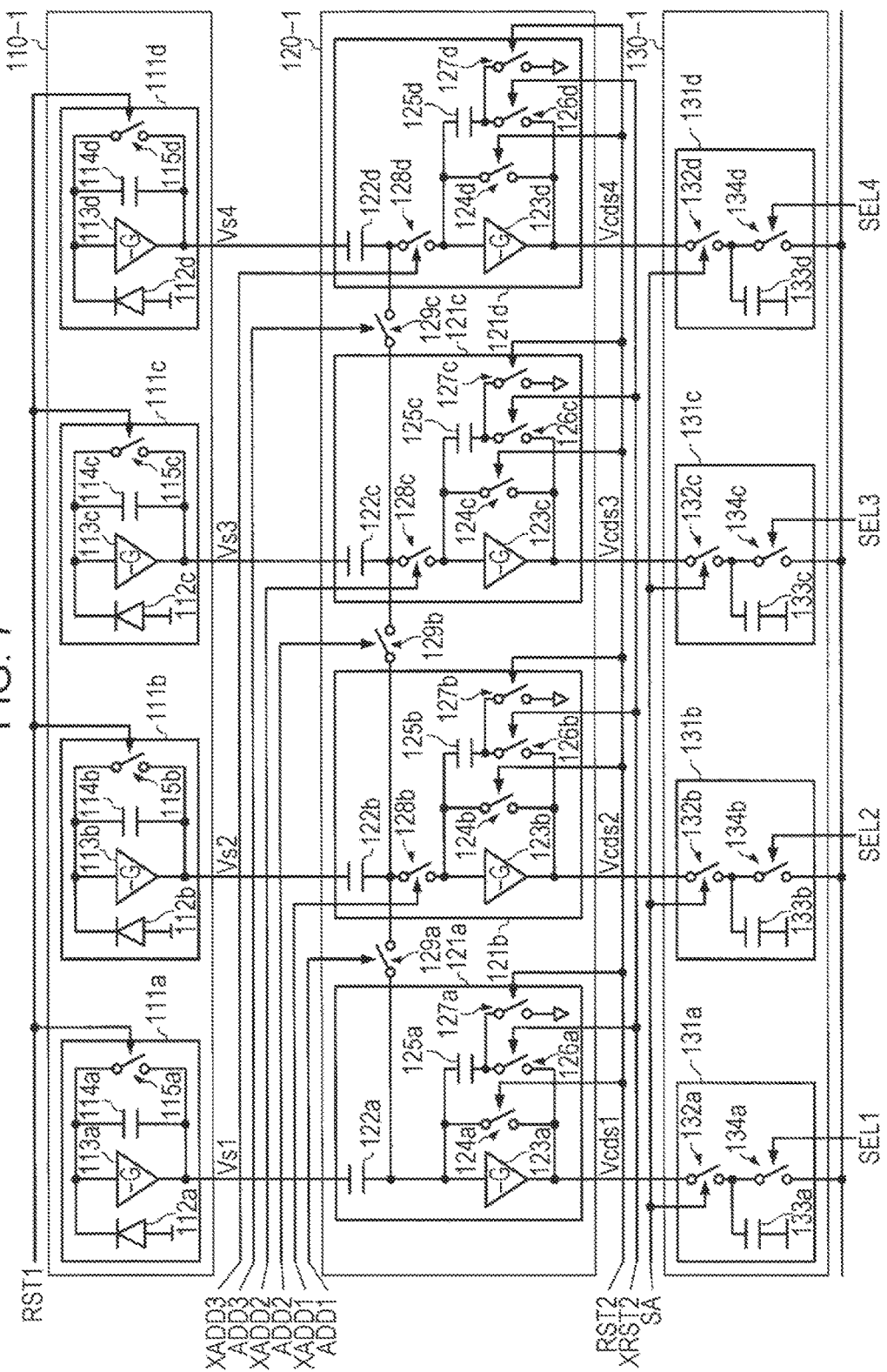
FIG. 7 is a diagram illustrating a circuit configuration example of a pixel unit, a reading circuit unit, and a memory unit.
Figure 10:
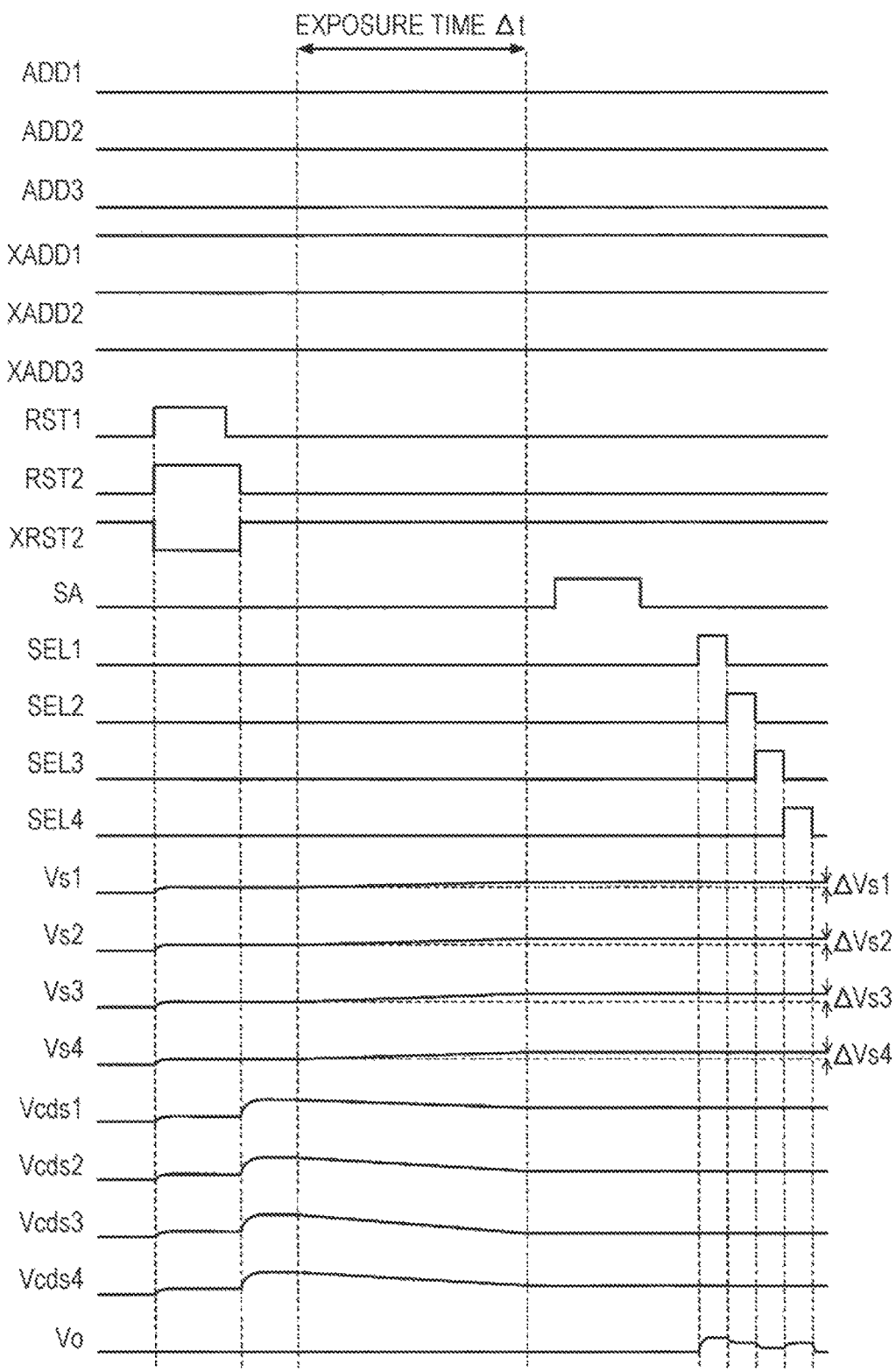
FIG. 10 is a timing chart in a case where the resolution is set to 1200 dpi.
Figure 11:
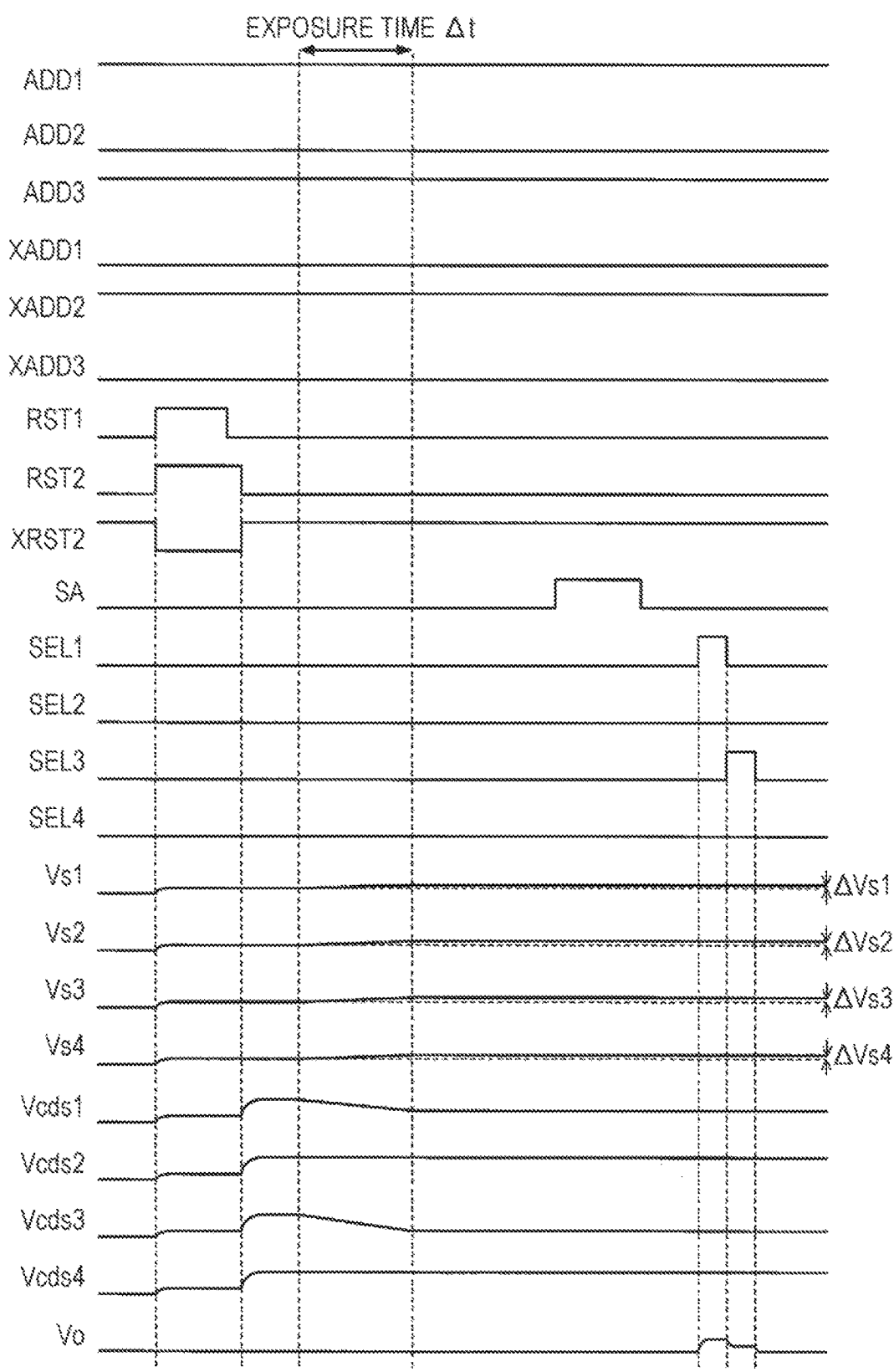
FIG. 11 is a timing chart in a case where the resolution is set to 600 dpi.
Figure 12:
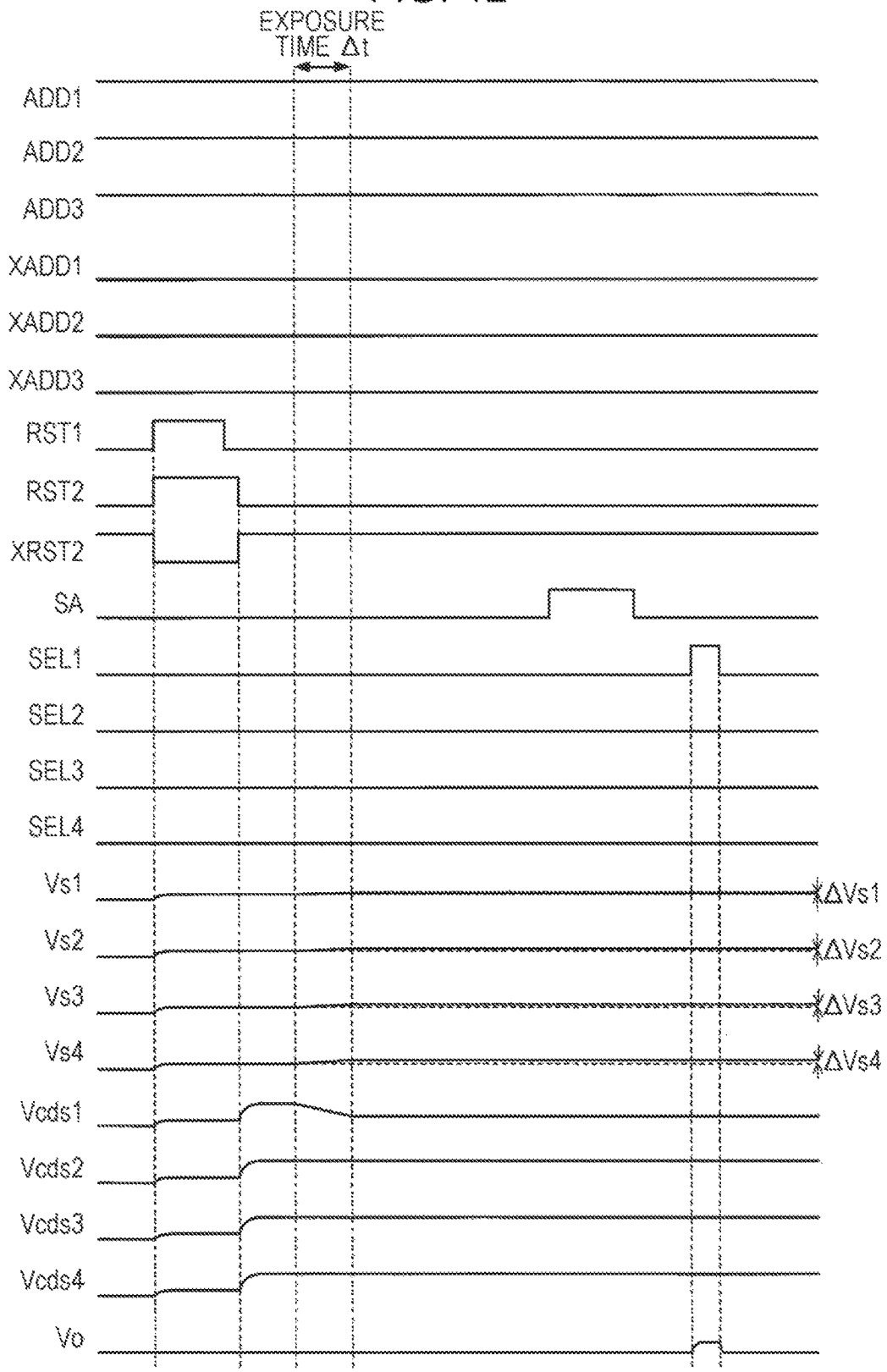
FIG. 12 is a timing chart in a case where the resolution is set to 300 dpi.

1-4. Configuration and Operation of Pixel Unit, Reading circuit unit, and Memory Unit FIG. 7 is a diagram illustrating a circuit configuration example of the pixel unit 110-1, the reading circuit unit 120-1, and the memory unit 130-1. Circuit configurations of the pixel unit 110-k (k=2 to n), the reading circuit unit 120-k, and the memory unit 130-k are the same as the circuit configurations of the pixel unit 110-1, the reading circuit unit 120-1, and the memory unit 130-1. In addition, FIG. 10, FIG. 11, and FIG. 12 are timing charts in a case where resolutions of the image which is read by the scanner unit (image reading apparatus) 3 are respectively 1200 dpi, 600 dpi, and 300 dpi.

As illustrated in FIG. 7, the pixel unit 110-1 is configured to include four pixel circuits 111a, 111b, 111c, and 111d.

The pixel circuit 111a (example of a "first pixel") includes a light receiving element 112a, an inverting amplifier 113a, a capacitor 114a, and a switch 115a.

The light receiving element 112a (example of a "first light receiving element") receives light (in the present embodiment, light from an image formed in a medium to be read) and converts (photoelectric conversion) the light into an electrical signal. In the present embodiment, the light receiving element 112a is configured with a photodiode, an anode thereof is grounded, and a cathode thereof is electrically connected to an input terminal of the inverting amplifier 113a.

The inverting amplifier 113a (example of a "first inverting amplifier) is electrically connected to the light receiving element 112a, and inversely amplifies a signal generated by the photoelectric conversion which is performed by the light receiving element 112a. Specifically, the inverting amplifier 113a has an input terminal electrically connected to the cathode of the light receiving element 112a, and an output terminal which outputs a voltage obtained by multiplying a voltage of the input terminal by −G. An output voltage of the inverting amplifier 113a becomes the output voltage (pixel voltage) Vs1 of the pixel circuit 111a.

The capacitor 114a (example of a "third capacitor") is electrically connected to both terminals (input terminal and output terminal) of the inverting amplifier 113a in parallel with the inverting amplifier 113a. That is, the capacitor 114a functions as a feedback capacitor provided in a signal feedback path from the output terminal of the inverting amplifier 113a to the input terminal thereof.

The switch 115a (example of a "fourth switch") is electrically connected to both terminals (input terminal and output terminal) of the inverting amplifier 113a in parallel with the inverting amplifier 113a.

In addition, the pixel circuit 111b (example of a "second pixel") includes a light receiving element 112b, an inverting amplifier 113b, a capacitor 114b, and a switch 115b.

The light receiving element 112b (example of a "second light receiving element") receives light (in the present embodiment, light from an image formed in a medium to be read) and converts (photoelectric conversion) the light into an electrical signal. In the present embodiment, the light receiving element 112b is configured with a photodiode, an anode thereof is grounded, and a cathode thereof is electrically connected to an input terminal of the inverting amplifier 113b.

The inverting amplifier 113b (example of a "second inverting amplifier) is electrically connected to the light receiving element 112b, and inversely amplifies a signal generated by the photoelectric conversion which is performed by the light receiving element 112b. Specifically, the inverting amplifier 113b has an input terminal electrically connected to the cathode of the light receiving element 112b, and an output terminal which outputs a voltage obtained by multiplying a voltage of the input terminal by −G. An output voltage of the inverting amplifier 113b becomes the output voltage (pixel voltage) Vs2 of the pixel circuit 111b.

The capacitor 114b (example of a "four capacitor") is electrically connected to both terminals (input terminal and output terminal) of the inverting amplifier 113b in parallel with the inverting amplifier 113b. That is, the capacitor 114b functions as a feedback capacitor provided in a signal feedback path from the output terminal of the inverting amplifier 113b to the input terminal thereof.

The switch 115b (example of a "fifth switch") is electrically connected to both terminals (input terminal and output terminal) of the inverting amplifier 113b in parallel with the inverting amplifier 113b.

In addition, description is omitted, but the pixel circuit 111c includes a light receiving element 112c, an inverting amplifier 113c, a capacitor 114c, and a switch 115c, has the same configuration as the pixel circuits 111a and 111b, and an output voltage of the inverting amplifier 113c becomes the output voltage (pixel voltage) Vs3 of the pixel circuit 111c. In the same manner, description is omitted, but the pixel circuit 111d includes a light receiving element 112d, an inverting amplifier 113d, a capacitor 114d, and a switch 115d, has the same configuration as the pixel circuits 111a and 111b, and an output voltage of the inverting amplifier 113d becomes the output voltage (pixel voltage) Vs4 of the pixel circuit 111d.

Each control terminal of the four switches 115a, 115b, 115c, and 115d is commonly connected to the reset signal RST1, both terminals of each of the switches 115a, 115b, 115c, and 115d are electrically connected to each other when the reset signal RST1 is active (high level), and the both terminals of each of the switches 115a, 115b, 115c, and 115d are electrically disconnected when the reset signal RST1 is inactive (low level). As described above, the reset signal RST1 is active (high level) for a constant time at predetermined timing before the red LED 412R, the green LED 412G, and the blue LED 412B emit light (before the exposure time Δt). At this time, since both terminals of each of the switches 115a, 115b, 115c, and 115d are electrically connected to each other, both terminals of each of the capacitors 114a, 114b, 114c, and 114d are short-circuited and thereby electric charges accumulated therein are reset (refer to FIG. 10 to FIG. 12). The four capacitors 114a, 114b, 114c, and 114d have the same capacitance value $C_{f1}$ as each other.

Figures 8, 9:
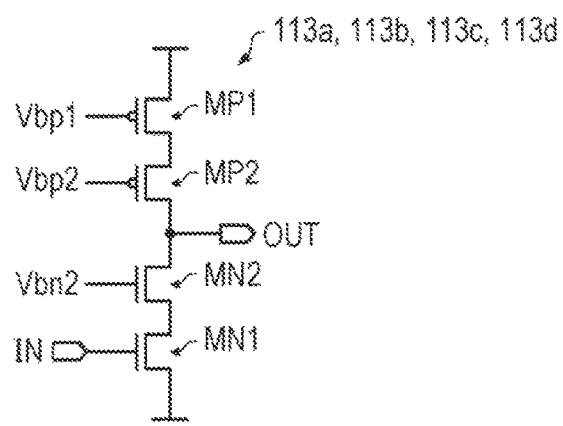
FIG. 8 is a diagram illustrating a circuit configuration example of an inverting amplifier.
FIG. 9 is a diagram illustrating a relationship between resolution and switch control signals.

FIG. 8 is a diagram illustrating a circuit configuration example of the inverting amplifiers 113a, 113b, 113c, and 113d. As illustrated in FIG. 8, the inverting amplifiers 113a, 113b, 113c, and 113d each include an NMOS transistor MN1, an NMOS transistor MN2, a PMOS transistor MP1, and a PMOS transistor MP2.

The NMOS transistor MN1 has a gate terminal connected to an input terminal IN, a source terminal which is grounded, and a drain terminal connected to a source terminal of the NMOS transistor MN2. Thus, the gate terminal of the NMOS transistor MN1 receives a signal generated by photoelectric conversion of the light receiving elements 112a, 112b, 112c, and 112d.

The NMOS transistor MN2 has a gate terminal which receives a constant bias voltage Vbn2, a source terminal connected to the drain terminal of the NMOS transistor MN1, and a drain terminal connected to a drain terminal of the PMOS transistor MP2 and an output terminal OUT. That is, the NMOS transistor MN2 is electrically connected between the NMOS transistor MN1 and the output terminal OUT, and the NMOS transistor MN1 and the NMOS transistor MN2 are cascade-connected.

The PMOS transistor MP1 has a gate terminal which receives a constant bias voltage Vbp1, a source terminal which receives a power supply voltage that is supplied from an external device to the image reading chip 415, and a drain terminal connected to a source terminal of the PMOS transistor MP2.

The PMOS transistor MP2 has a gate terminal which receives a constant bias voltage Vbp2, the source terminal connected to the drain terminal of the PMOS transistor MP1, and the drain terminal connected to the drain terminal of the NMOS transistor MN2 and the output terminal OUT.

The bias voltages Vbn2, vbp1, and Vbp2 are constant voltages which respectively make the NMOS transistor the NMOS transistor MN2, the PMOS transistor MP1, and the PMOS transistor MP2 operate in a saturation region, and are generated by constant voltage sources which are not illustrated in FIG. 7 and FIG. 8.

In the inverting amplifiers 113a, 113b, 113c, and 113d having aforementioned configuration, the PMOS transistor MP1 functions as a constant current source, a constant current from the PMOS transistor MP1 flows between the drain terminal and the source terminal of the NMOS transistor MN1, and thereby, a drain voltage of the NMOS transistor MN1 becomes a voltage obtained by inversely amplifying a voltage of the input terminal IN. The NMOS transistor MN2 and the PMOS transistor MP2 are provided to increase output impedance, in other words, the NMOS transistor MN2 and the PMOS transistor MP2 are provided to increase a voltage amplification factor G. Thereby, the voltage amplification factor G of 1000 times or more is realized.

Returning to FIG. 7, the reading circuit unit 120-1 is configured with four reading circuits 121a, 121b, 121c, and 121d, and three switches 129a, 129b, and 129c.

The reading circuit 121a (example of a "first reading circuit) includes a capacitor 122a, an inverting amplifier 123a, a switch 124a, a capacitor 125a, a switch 126a, and a switch 127a.

The capacitor 122a (example of a "first capacitor") is electrically connected to the pixel circuit 111a. Specifically, the capacitor 122a has one terminal electrically connected to the output terminal of the inverting amplifier 113a, and the other terminal electrically connected to an input terminal of the inverting amplifier 123a.

The inverting amplifier 123a (example of a "first amplifier") has the input terminal electrically connected to the other terminal of the capacitor 122a, and outputs a voltage obtained by multiplying a voltage of the input terminal by −G from the output terminal. An output voltage of the inverting amplifier 123a becomes the read voltage Vcds1 which is output from the reading circuit 121a.

The switch 124a is electrically connected to both terminals (input terminal and output terminal) of the inverting amplifier 123a in parallel with the inverting amplifier 123a.

The capacitor 125a has one terminal electrically connected to the input terminal of the inverting amplifier 123a, and the other terminal electrically connected to one terminal of the switch 126a.

The switch 126a has one terminal electrically connected to the other terminal of the capacitor 125a, and the other terminal electrically connected to the output terminal of the inverting amplifier 123a.

The switch 127a has one terminal electrically connected to the other terminal of the capacitor 125a, and the other terminal which receives a reference voltage VREF (for example, 2.4 V).

The reading circuit 121a configured as described above performs noise cancellation of the output voltage (pixel voltage) Vs1 of the pixel circuit 111a by using the capacitor 122a, and furthermore, functions as a correlated double sampling (CDS) circuit which inversely amplifies the output voltage by using the inverting amplifier 123a.

The reading circuit 121b (example of a "second reading circuit) includes a capacitor 122b, an inverting amplifier 123b, a switch 124b, a capacitor 125b, a switch 126b, a switch 127b, and a switch 128b.

The capacitor 122b (example of a "second capacitor") is electrically connected to the pixel circuit 111b. Specifically, the capacitor 122b has one terminal electrically connected to the output terminal of the inverting amplifier 113b, and the other terminal electrically connected to one terminal of a switch 128b.

The switch 128b (example of the "first switch") has one terminal electrically connected to the other terminal of the capacitor 122b, and the other terminal electrically connected to an input terminal of the inverting amplifier 123b, and switches whether or not to electrically connect the capacitor 122b to the input terminal of the inverting amplifier 123b.

The inverting amplifier 123b (example of a "second amplifier") has the input terminal electrically connected to the other terminal of the switch 128b, and outputs a voltage obtained by multiplying a voltage of the input terminal by −G from the output terminal. An output voltage of the inverting amplifier 123b becomes the read voltage Vcds2 which is output from the reading circuit 121b.

The switch 124b is electrically connected to both terminals (input terminal and output terminal) of the inverting amplifier 123b in parallel with the inverting amplifier 123b.

The capacitor 125b has one terminal electrically connected to the input terminal of the inverting amplifier 123b, and the other terminal electrically connected to one terminal of the switch 126b.

The switch 126b has one terminal electrically connected to the other terminal of the capacitor 125b, and the other terminal electrically connected to the output terminal of the inverting amplifier 123b.

The switch 127b has one terminal electrically connected to the other terminal of the capacitor 125b, and the other terminal which receives the reference voltage VREF.

The reading circuit 121b configured as described above performs noise cancellation of the output voltage (pixel voltage) Vs2 of the pixel circuit 111b by using the capacitor 122b, and furthermore, functions as the CDS circuit which inversely amplifies the output voltage by using the inverting amplifier 123b.

In addition, description is omitted, but the reading circuit 121c includes a capacitor 122c, an inverting amplifier 123c, a switch 124c, a capacitor 125c, a switch 126c, a switch 127c, and a switch 128c, is a CDS circuit having the same configuration as the reading circuit 121b, and an output voltage of the inverting amplifier 123c becomes the read voltage Vcds3 which is output from the reading circuit 121c.

In the same manner, description is omitted, but the reading circuit 121d includes a capacitor 122d, an inverting amplifier 123d, a switch 124d, a capacitor 125d, a switch 126d, a switch 127d, and a switch 128d, is a CDS circuit having the same configuration as the reading circuit 121b, and an output voltage of the inverting amplifier 123d becomes the read voltage Vcds4 which is output from the reading circuit 121d.

Each control terminal of the eight switches 124a, 127a, 124b, 127b, 124c, 127c, 124d, and 127d commonly receives the reset signal RST2, both terminals of each of the switches 124a, 127a, 124b, 127b, 124c, 127c, 124d, and 127d are electrically connected to each other when the reset signal RST2 is active (high level), and both terminals of each of the switches 124a, 127a, 124b, 127b, 124c, 127c, 124d, and 127d are electrically disconnected when the reset signal RST2 is inactive (low level). In addition, each control terminal of the four switches 126a, 126b, 126c, and 126d commonly receives the reset signal RST2, both terminals of each of the switches 126a, 126b, 126c, and 126d are electrically connected to each other when the reset signal RST2 is active (high level), and both terminals of each of the switches 126a, 126b, 126c, and 126d are electrically disconnected when the reset signal RST2 is inactive (low level).

As described above, the reset signal RST2 is active (high level) for a constant time at predetermined timing before the red LED 412R, the green LED 412G, and the blue LED 412B emit light (before the exposure time Δt). At this time, since both terminals of each of the switches 124a, 127a, 124b, 127b, 124c, 127c, 124d, and 127d are electrically connected to each other, and since the reset signal XRST2 is a logical inverting signal of the reset signal RST2, both terminals of each of the switches 126a, 126b, 126c, and 126d are electrically disconnected. Thereby, the input terminal and the output terminal of each of the inverting amplifiers 123a, 123b, 123c, and 123d are short-circuited, the input terminals of the inverting amplifiers 123a, 123b, 123c, and 123d have a predetermined voltage Vt, a potential difference of (Vt−VREF) occurs between both terminals of each the capacitors 125a, 125b, 125c, and 125d, and electric charges according to the potential difference are accumulated (reset) in the capacitors (refer to FIG. 10 to FIG. 12).

Thereafter, if the reset signal RST2 is inactive (low level), both terminals of each of the switches 126a, 126b, 126c, and 126d are electrically connected to each other, and both terminals of the switches 124a, 127a, 124b, 127b, 124c, 127c, 124d, and 127d are electrically disconnected. At this time, the capacitors 125a, 125b, 125c, and 125d are respectively connected to both terminals of the inverting amplifiers 123a, 123b, 123c, and 123d, and function as feedback capacitors.

The four capacitors 122a, 122b, 122c, and 122d have the same capacitance value $C_{i2}$, and the four capacitors 125a, 125b, 125c, and 125d have the same capacitance value $C_{f2}$.

The switch 129a has one terminal electrically connected to the other terminal of the capacitor 122a, and the other terminal electrically connected to the other terminal of the capacitor 122b. The switch 129a (example of a "second switch") functions as a switch which switches whether or not to electrically connect a node (example of a "first node") between the capacitor 122a and the inverting amplifier 123a to a node (example of a "second node") between the capacitor 122b and the inverting amplifier 123b. A control terminal of the switch 129a receives the switch control signal ADD1, both terminals of the switch 129a are electrically connected to each other when the switch control signal ADD1 is active (high level), and the both terminals of the switch 129a are electrically disconnected when the switch control signal ADD1 is inactive (low level). Meanwhile, a control terminal of the switch 128b receives the switch control signal XADD1, both terminals of the switch 128b are electrically connected to each other when the switch control signal XADD1 is active (high level), and the both terminals of the switch 128b are electrically disconnected when the switch control signal XADD1 is inactive (low level). As described above, since the switch control signal XADD1 is a logical inverting signal of the switch control signal ADD1, in a case where the switch 128b is in an electrical disconnection state, the switch 129a is in an electrical connection state, and in a case where the switch 128b is in an electrical connection state, the switch 129a is in an electrical disconnection state.

In the same manner, the switch 129b has one terminal electrically connected to the other terminal of the capacitor 122b, and the other terminal electrically connected to the other terminal of the capacitor 122c. The switch 129b functions as a switch which switches whether or not to connect a node between the capacitor 122b and the inverting amplifier 123b to a node between the capacitor 122c and the inverting amplifier 123c. A control terminal of the switch 129b receives the switch control signal ADD2, both terminals of the switch 129b are electrically connected to each other when the switch control signal ADD2 is active (high level), and the both terminals of the switch 129b are electrically disconnected when the switch control signal ADD2 is inactive (low level). Meanwhile, a control terminal of the switch 128c receives the switch control signal XADD2, both terminals of the switch 128c are electrically connected to each other when the switch control signal XADD2 is active (high level), and the both terminals of the switch 128c are electrically disconnected when the switch control signal XADD2 is inactive (low level). As described above, since the switch control signal XADD2 is a logical inverting signal of the switch control signal ADD2, in a case where the switch 128c is in an electrical disconnection state, the switch 129b is in an electrical connection state, and in a case where the switch 128c is in an electrical connection state, the switch 129b is in an electrical disconnection state.

In the same manner, the switch 129c has one terminal electrically connected to the other terminal of the capacitor 122c, and the other terminal electrically connected to the other terminal of the capacitor 122d. The switch 129c functions as a switch which switches whether or not to connect a node between the capacitor 122c and the inverting amplifier 123c to a node between the capacitor 122d and the inverting amplifier 123d. A control terminal of the switch 129c receives the switch control signal ADD3, both terminals of the switch 129c are electrically connected to each other when the switch control signal ADD3 is active (high level), and the both terminals of the switch 129c are electrically disconnected when the switch control signal ADD3 is inactive (low level). Meanwhile, a control terminal of the switch 128d receives the switch control signal XADD3, both terminals of the switch 128d are electrically connected to each other when the switch control signal XADD3 is active (high level), and the both terminals of the switch 128d are electrically disconnected when the switch control signal XADD3 is inactive (low level). As described above, since the switch control signal XADD3 is a logical inverting signal of the switch control signal ADD3, in a case where the switch 128d is in an electrical disconnection state, the switch 129c is in an electrical connection state, and in a case where the switch 128d is in an electrical connection state, the switch 129c is in an electrical disconnection state.

In a case where the switch 128b is in an electrical disconnection state and the switch 129a is in an electrical connection state, an operation of the reading circuit 121b may be stopped. In the same manner, in a case where the switch 128c is in an electrical disconnection state and the switch 129b is in an electrical connection state, an operation of the reading circuit 121c may be stopped. In the same manner, in a case where the switch 128d is in an electrical disconnection state and the switch 129c is in an electrical connection state, an operation of the reading circuit 121d may be stopped. Specifically, the switch control signals XADD1, XADD2, and XADD3 are respectively supplied to the inverting amplifiers 123b, 123c, and 123d as enable signals.

FIG. 9 is a diagram illustrating a relationship between resolution and the switch control signals ADD1, ADD2, and ADD3. As illustrated in FIG. 9, in a case where resolution is set to 1200 dpi, all the switch control signals ADD1, ADD2, and ADD3 go to a low level (all the switch control signals XADD1, XADD2, and XADD3 go to a high level) (refer to FIG. 10). Thus, the switches 128b, 128c, and 128d enter an electrical connection state, and the switches 129a, 129b, and 129c enter an electrical disconnection state. In this case, if potential differences (voltages which change as the exposure time Δt elapses) of each of the pixel voltages Vs1 to Vs4 before and after exposure are referred to as ΔVs1 to ΔVs4, the read voltages Vcds1 to Vcds4 are obtained by following expression (1).

$$Vcds1 = VREF - \frac{C_{i2}}{C_{f2}} \cdot \Delta Vs1 \qquad (1)$$

$$Vcds2 = VREF - \frac{C_{i2}}{C_{f2}} \cdot \Delta Vs2$$

$$Vcds3 = VREF - \frac{C_{i2}}{C_{f2}} \cdot \Delta Vs3$$

$$Vcds4 = VREF - \frac{C_{i2}}{C_{f2}} \cdot \Delta Vs4$$

In addition, in a case where resolution is set to 600 dpi, the switch control signals ADD1 and ADD3 go to a high level (the switch control signals XADD1 and XADD3 go to a low level), and the switch control signal ADD2 goes to a low level (the switch control signal XADD2 goes to a high level) (refer to FIG. 11). Thus, the switches 128c, 129a, and 129c enter an electrical connection state, and the switches 128b, 128d, and 129b enter an electrical disconnection state. In this case, if potential differences (voltages which change as the exposure time Δt elapses) of each of the pixel voltages Vs1 to Vs4 before and after exposure are referred to as ΔVs1 to ΔVs4, the read voltages Vcds1 to Vcds4 are obtained by following expression (2).

$$Vcds1 = VREF - \frac{C_{i2}}{C_{f2}} \cdot (\Delta Vs1 + \Delta Vs2) \quad (2)$$

$$Vcds2 = VREF$$

$$Vcds3 = VREF - \frac{C_{i2}}{C_{f2}} \cdot (\Delta Vs3 + \Delta Vs4)$$

$$Vcds4 = VREF$$

As expressed in Expression (2), the read voltage Vcds1 becomes a voltage obtained by adding the potential differences ΔVs1 and ΔVs2, which occur before and after exposure, of the pixel voltages Vs1 and Vs2 together and inversely amplifying the added potential difference, and the read voltage Vcds3 becomes a voltage obtained by adding the potential differences ΔVs3 and ΔVs4, which occur before and after exposure, of the pixel voltages Vs3 and Vs4 together and inversely amplifying the added potential difference. As such, in a case where resolution is set to 600 dpi, combination of two pixels is performed.

In addition, in a case where resolution is set to 300 dpi, all the switch control signals ADD1, ADD2, and ADD3 go to a high level (all the switch control signals XADD1, XADD2, and XADD3 go to a low level) (refer to FIG. 12). Thus, the switches 129a, 129b, and 129c enter an electrical connection state, and the switches 128b, 128c, and 128d enter an electrical disconnection state. In this case, if potential differences (voltages which change as the exposure time Δt elapses) of each of the pixel voltages Vs1 to Vs4 before and after exposure are referred to as ΔVs1 to ΔVs4, the read voltages Vcds1 to Vcds4 are obtained by following expression (3).

$$Vcds1 = VREF - \frac{C_{i2}}{C_{f2}} \cdot (\Delta Vs1 + \Delta Vs2 + \Delta Vs3 + \Delta Vs4) \quad (3)$$

$$Vcds2 = VREF$$

$$Vcds3 = VREF$$

$$Vcds4 = VREF$$

As expressed in Expression (3), the read voltage Vcds1 becomes a voltage obtained by adding the potential differences ΔVs1, ΔVs2, ΔVs3, and ΔVs4, which occur before and after exposure, of the pixel voltages Vs1, Vs2, Vs3, and Vs4 together and inversely amplifying the added potential difference. As such, in a case where resolution is set to 300 dpi, combination of four pixels is performed.

Returning to FIG. 7, the memory unit 130-1 is configured to include four memory circuits 131a, 131b, 131c, and 131d.

The memory circuit 131a includes a switch 132a, a capacitor 133a, and a switch 134a.

The switch 132a is electrically connected to the reading circuit 121a. Specifically, the switch 132a has one terminal electrically connected to the output terminal (output terminal of the reading circuit 121a) of the inverting amplifier 123a, and the other terminal electrically connected to one terminal of the capacitor 133a.

The capacitor 133a has one terminal electrically connected to the other terminal of the switch 132a, and the other terminal which receives a predetermined reference potential (for example, ground potential (0 V)).

The switch 134a has one terminal electrically connected to the other terminal of the capacitor 133a, and the other terminal electrically connected to a non-inverting input terminal of the operational amplifier 105.

In addition, memory circuit 131b includes a switch 132b, a capacitor 133b, and a switch 134b.

The switch 132b is electrically connected to the reading circuit 121b. Specifically, the switch 132b has one terminal electrically connected to the output terminal (output terminal of the reading circuit 121b) of the inverting amplifier 123b, and the other terminal electrically connected to one terminal of the capacitor 133b.

The capacitor 133b has one terminal electrically connected to the other terminal of the switch 132b, and the other terminal which receives a predetermined reference potential (for example, ground potential (0 V)).

The switch 134b has one terminal electrically connected to the other terminal of the capacitor 133b, and the other terminal electrically connected to the non-inverting input terminal of the operational amplifier 105.

In addition, description is omitted, but the memory circuit 131c includes a switch 132c, a capacitor 133c, and a switch 134c, and has the same configuration as the memory circuits 131a and 131b. In the same manner, the memory circuit 131d includes a switch 132d, a capacitor 133d, and a switch 134d, and has the same configuration as the memory circuits 131a and 131b.

Each control terminal of the four switches 132a, 132b, 132c, and 132d commonly receives the read signal SA, both terminals of each of the switches 132a, 132b, 132c, and 132d are electrically connected to each other when the read signal SA is active (high level), and the both terminals of each of the switches 132a, 132b, 132c, and 132d are electrically disconnected when the read signal SA is inactive (low level). As described above, the read signal SA is active (high level) for a constant time at predetermined timing before the red LED 412R, the green LED 412G, and the blue LED 412B ends emission of the light. Thereby, both terminals of each of the switches 132a, 132b, 132c, and 132d are electrically connected to each other, and the capacitors 133a, 133b, 133c, and 133d respectively retain electric charges according to the read voltages Vcds1, Vcds2, Vcds3, and Vcds4 which are respectively output from the reading circuits 121a, 121b, 121c, and 121d.

In addition, a control terminal of the switch 134a receives the selection signal SEL1, both terminals of the switch 134a are electrically connected to each other when the selection signal SEL1 is active (high level), and the both terminals of the switch 134a are electrically disconnected when the selection signal SEL1 is inactive (low level). In addition, a control terminal of the switch 134b receives the selection signal SEL2, both terminals of the switch 134b are electrically connected to each other when the selection signal SEL2 is active (high level), and the both terminals of the switch 134b are electrically disconnected when the selection signal SEL2 is inactive (low level). In addition, a control terminal of the switch 134c receives the selection signal SEL3, both terminals of the switch 134c are electrically connected to each other when the selection signal SEL3 is active (high level), and the both terminals of the switch 134c are electrically disconnected when the selection signal SEL3 is inactive (low level). In addition, a control terminal of the switch 134d receives the selection signal SEL4, both terminals of the switch 134d are electrically connected to each other when the selection signal SEL4 is active (high level), and the both terminals of the switch 134d are electrically disconnected when the selection signal SEL4 is inactive (low level).

As described above, the selection signals SEL1 to SEL4 are active (high level) for a constant time exclusively from each other at predetermined timing after the read signal SA changes from an active (high level) state to an inactive state (low level). Hence, when the selection signal SEL1 is active (high level), one terminal of the capacitor 133a is electrically connected to the non-inverting input terminal of the operational amplifier 105 through the switch 134a, and a voltage of the image signal Vo becomes a voltage (read voltage Vcds1) according to the electric charges accumulated in the capacitor 133a (refer to FIG. 10 to FIG. 12). In addition, when the selection signal SEL2 is active (high level), one terminal of the capacitor 133b is electrically connected to the non-inverting input terminal of the operational amplifier 105 through the switch 134b, and the voltage of the image signal Vo becomes a voltage (read voltage Vcds2) according to the electric charges accumulated in the capacitor 133b (refer to FIG. 10). In addition, when the selection signal SEL3 is active (high level), one terminal of the capacitor 133c is electrically connected to the non-inverting input terminal of the operational amplifier 105 through the switch 134c, and the voltage of the image signal Vo becomes a voltage (read voltage Vcds3) according to the electric charges accumulated in the capacitor 133c (refer to FIG. 10 and FIG. 11). In addition, when the selection signal SEL4 is active (high level), one terminal of the capacitor 133d is electrically connected to the non-inverting input terminal of the operational amplifier 105 through the switch 134d, and the voltage of the image signal Vo becomes a voltage (read voltage Vcds4) according to the electric charges accumulated in the capacitor 133d (refer to FIG. 10).

1-5. Action Effects

Generally, since sensitivity of a pixel is inversely proportional to detection capacitance of the pixel, it is preferable that the detection capacitance be small (for example, several fF). Thus, in the same manner as the related art, if a transfer switch in a pixel circuit is turned on and thereby a combination of pixels is performed, the proportion of voltage components which are suppressed by a leakage current that is generated in the transfer switch can significantly increase in a signal which is obtained by the combination of pixels, and image quality of a read image can be degraded. For example, if the detection capacitance is 2 fF and the leakage current which is generated in a transfer gate is 10 pA and exposure time is 1000 µs, the voltage components due to the leakage current are 500 mV as well.

In contrast to this, in the image reading chip 415 in the scanner unit (image reading apparatus) 3 according to the first embodiment, since the reading circuits 121a, 121b, 121c, and 121d have small constraint of an absolute value of capacitance, compared with the pixel circuits 111a, 111b, 111c, and 111d, the capacitors 122a, 122b, 122c, and 122d which are feedback capacitors can be much larger (for example, several hundred fF) than the capacitors 114a, 114b, 114c, and 114d (for example, several fF) which are detection capacitances. Hence, in the image reading chip 415 in the scanner unit (image reading apparatus) 3 according to the first embodiment, in a case where the switch 129a and the switch 129c which are the transfer switches are in an electrical connection state and the switch 129b is in an electrical disconnection state, a combination of two pixels is performed, and in a case where the switches 129a, 129b, and 129c which are the transfer switches are all in an electrical connection state, a combination of four pixels is performed, and thus, a ratio of voltage components which are suppressed by a leakage current that is generated in the switches 115a, 115b, 115c, and 115d can significantly increase in a signal which is obtained by the combination of pixels, and image quality of a read image can increase. For example, if the capacitors 122a, 122b, 122c, and 122d (feedback capacitors) respectively have 0.2 pF and the leakage current which is generated in the switches 115a, 115b, 115c, and 115d (transfer switches) is 10 pA and exposure time is 1000 µs, the voltage components due to the leakage current are reduced to, for example, 5 mV.

Particularly, in the image reading chip 415 in the scanner unit (image reading apparatus) 3 according to the first embodiment, the pixel circuits 111a, 111b, 111c, and 111d are not pixels which transfer electric charges generated by photoelectric conversion of light receiving elements by using transfer gates, but are pixels (pixels of an inverting amplification type) which use the inverting amplifiers 113a, 113b, 113c, and 113d, in the same manner as the related art, and thus, in order for each of the pixel units 110-1 to 110-n to perform a combination of pixels, the transfer switches are required, but a leakage current of the transfer switch tends to be larger than the leakage of the transfer gate in the related art. However, in the image reading chip 415 in the scanner unit (image reading apparatus) 3 according to the first embodiment, a combination of pixels is performed in each of the pixel units 110-1 to 110-n, and thus, the transfer switches need not be provided in the pixel units 110-1 to 110-n, and the leakage current is hard to increase.

In addition, according to the first embodiment, the reading circuit units 120-1 to 120-n in a rear stage of the pixel units 110-1 to 110-n perform the combination of pixels, and thus, in a case where the scanner unit (image reading apparatus) 3 having the number of combined pixels (resolution) different from the previous number is developed, new development of the pixel units 110-1 to 110-n is not required, and development cost is reduced and development period is shortened.

In addition, in the image reading chip 415 in the scanner unit (image reading apparatus) 3 according to the first embodiment, in a case where the switch 129a and the switch 129c are in an electrical connection state and the switch 129b is in an electrical disconnection state (in a case where a combination of two pixels is performed), a signal obtained by combining the pixels is output from the reading circuits 121a and 121c, and thus, the switches 128b and 128d enter an electrical disconnection state, and operations of the reading circuits 121b and 121d stop. In addition, in a case where the switches 129a, 129b, and 129c are all in an electrical connection state (in a case where a combination of four pixels is performed), a signal obtained by combining the pixels is output from the reading circuit 121a, and thus, the switches 128b, 128c, and 128d enter an electrical disconnection state, and operations of the reading circuits 121b, 121c, and 121d stop. Thus, according to the scanner unit (image reading apparatus) 3 of the image reading chip 415 of the first embodiment, it is possible to reduce power consumption.

2. Second Embodiment

Hereinafter, in the complexer 1 according to a second embodiment, the same symbols or reference numerals will be attached to the same configuration elements as in the first embodiment, description overlapping with the first embodiment will be omitted, and description different from the first embodiment will be mainly made.

A structure of the complexer 1 according to the second embodiment is the same as in the first embodiment (FIGS. 1 to 4), and thus, illustration and description thereof will be omitted. In addition, a functional block diagram of the scanner unit (image reading apparatus) 3 according to the second embodiment is the same as in the first embodiment (FIG. 5), and thus, illustration and description thereof will be omitted. In addition, a functional block diagram of the image reading chip 415 according to the second embodiment is the same as in the first embodiment (FIG. 6), and thus, illustration and description thereof will be omitted. However, in the second embodiment, a configuration of a timing control circuit 100 in the image reading chip 415 is different from that in the first embodiment.

Figure 13:
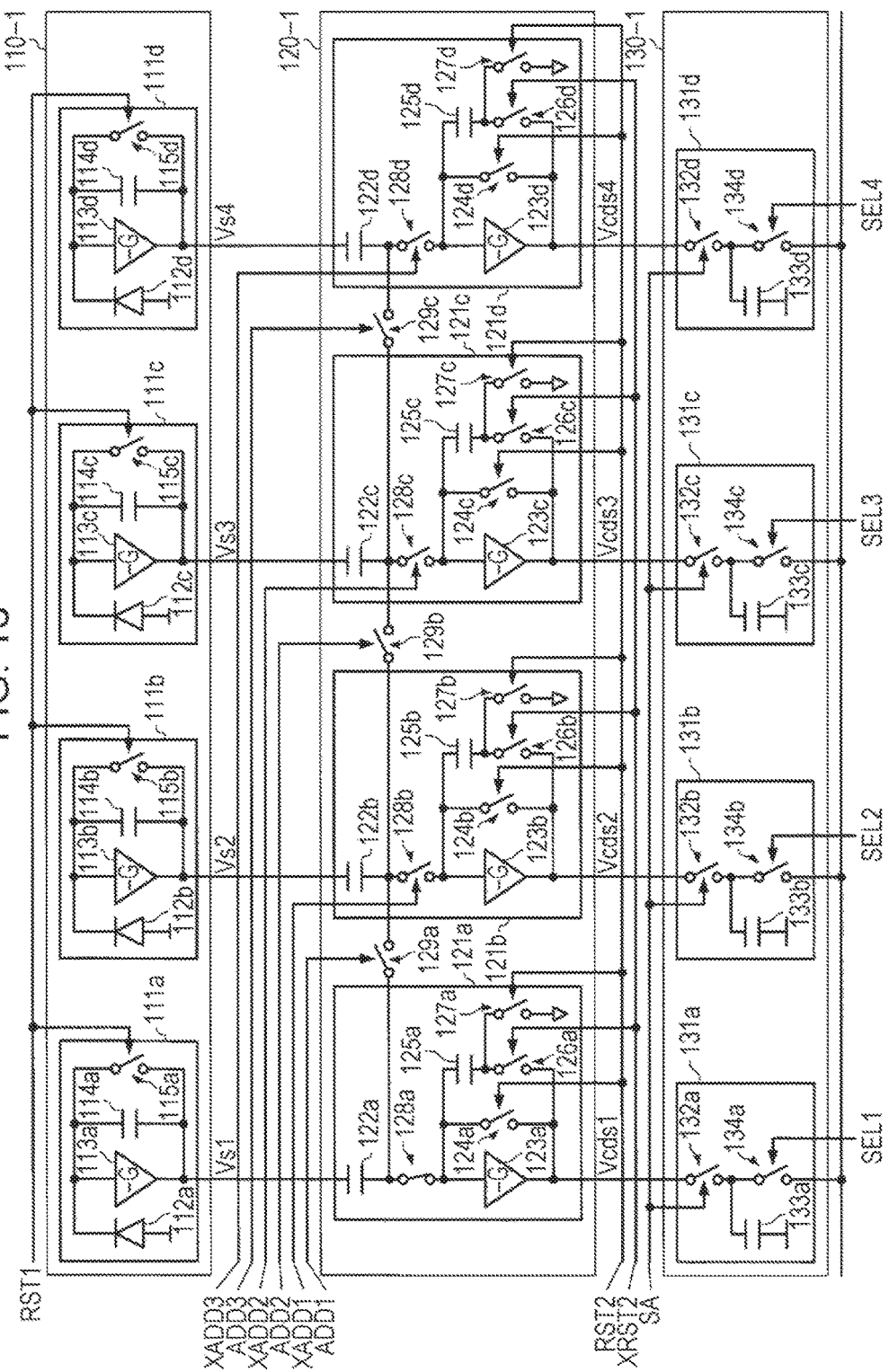
FIG. 13 is a diagram illustrating a circuit configuration example of a pixel unit, a reading circuit unit, and a memory unit according to a second embodiment.

FIG. 13 is a diagram illustrating a circuit configuration example of a pixel unit 110-1, a reading circuit unit 120-1, and a memory unit 130-1 according to the second embodiment. Circuit configurations of a pixel unit 110-$k$ ($k$=2 to n), a reading circuit unit 120-$k$, and a memory unit 130-$k$ are the same as circuit configurations of the pixel unit 110-1, the reading circuit unit 120-1, and the memory unit 130-1.

As illustrated in FIG. 13, the circuit configurations of the pixel unit 110-1 and the memory unit 130-1 according to the second embodiment are the same as in the first embodiment (FIG. 7), and thus, description thereof will be omitted.

The reading circuit unit 120-1 according to the second embodiment is configured to include four reading circuits 121a, 121b, 121c, and 121d, and three switches 129a, 129b, and 129c, in the same manner as the first embodiment. Configurations of the reading circuits 121b, 121c, and 121d according to the second embodiment are the same as in the first embodiment (FIG. 7), and thus, description thereof will be omitted.

The reading circuit 121a according to the second embodiment further includes a switch 128a, compared with the reading circuit 121a (FIG. 7) according to the first embodiment. The switch 128a (example of a "third switch") has one terminal electrically connected to the other terminal of the capacitor 122a and the other terminal electrically connected to the input terminal of the inverting amplifier 123a. The switch 128a is continuously in an electrical connection state, and electrically connects the capacitor 122a to the inverting amplifier 123a. The other configurations of the reading circuit 121a are the same as in the first embodiment (FIG. 7), and thus, description thereof will be omitted.

In the reading circuit 121a, which is configured as described above, according to the second embodiment, the switch 128a is continuously in an electrical connection state, and thus, a function and an operation thereof are the same as those of the reading circuit 121a according to the first embodiment.

Furthermore, in the second embodiment, the reading circuit 121a has the same configuration as the reading circuit 121b, 121c, and 121d in that the switch 128a is continuously in an electrical connection state differently from the switches 128b, 128c, and 128d.

In the first embodiment, in a case where resolution is set to 1200 dpi, (in a case where pixels are not combined), the switches 128b, 128c, and 128d are in an electrical connection state and the reading circuits 121a, 121b, 121c, and 121d which are CDS circuits all have the same function, but since the switch 128a is not provided, the reading circuit 121a has a slight difference in frequency characteristics and capacitance ratio, compared with the reading circuits 121b, 121c, and 121d. Accordingly, the reading circuit 121a has a slight difference in characteristics compared with the reading circuits 121b, 121c, and 121d and has a slight difference of image quality for each four pixel, but, since human eyes are sensitive to a change of cyclic image quality, the image quality may be degraded.

In contrast to this, in the second embodiment, since the switch 128a is not provided in the reading circuit 121a, in a case where resolution is set to 1200 dpi (in a case where pixels are not combined), the switches 128b, 128c, and 128d enters an electrical connection state and thus, the reading circuits 121a, 121b, 121c, and 121d all have the same configuration. Accordingly, the reading circuits 121a, 121b, 121c, and 121d have no difference of characteristics, cyclic noise components are reduced, and thus, it is possible to prevent image quality from being degraded when pixels are not combined.

According to the scanner unit (image reading apparatus) 3 of the second embodiment described above, the same effects as in the first embodiment are obtained, and furthermore, since the switch 128a is provided in the image reading chip 415, in a case where the switches 129a, 129b, and 129c are all in an electrical connection state (the switches 128a, 128b, 128c, and 128d are all in an electrical disconnection state), that is, in a case where pixels are not combined, the reading circuits 121a, 121b, 121c, and 121d all have the same configuration. As a result, a difference of characteristics of each output signal of the reading circuits 121a, 121b, 121c, and 121d is decreased, and thus, it is possible to increase image quality of a read image.

As described above, the present embodiments are described, but the invention is not limited to this, and can be realized in various forms in a range without departing from a gist thereof. For example, it is also possible to appropriately combine the respective embodiments.

In addition, for example, in the aforementioned each embodiment, a case where a combination of two pixels and a combination of four pixels can be performed is used as an example, but the invention can also be applied to an image reading apparatus or a semiconductor device in which a combination of three pixels, five pixels, or more can be performed.

The invention includes substantially the same configuration (for example, a configuration in which a function, a method, and results are the same, or a configuration in which an object and effects are the same) as the configuration described in the embodiments. In addition, the invention includes a configuration in which a non-essential part of the configuration described in the embodiments is replaced. In addition, the invention includes a configuration which obtains the same operational effects as those of the configuration described in the embodiments, or a configuration which can achieve the same object. In addition, the invention includes a configuration in which a known technology is added to the configuration described in the embodiments.

What is claimed is:

1. An image reading apparatus which reads an image, the apparatus comprising:
   a first pixel that includes a first light receiving element which performs photoelectric conversion;
   a second pixel that includes a second light receiving element which performs photoelectric conversion;
   a first reading circuit that includes a first capacitor which is electrically connected to the first pixel and a first amplifier having an input terminal which is electrically connected to the first capacitor;
   a second reading circuit that includes a second capacitor which is electrically connected to the second pixel, a second amplifier, and a first switch which switches whether or not to electrically connect the second capacitor to an input terminal of the second amplifier; and
   a second switch that switches whether or not to electrically connect a first node between the first capacitor and the first amplifier to a second node between the second capacitor and the second amplifier.

2. The image reading apparatus according to claim 1, wherein, in a case where the first switch is in an electrical disconnection state, the second switch enters an electrical connection state, and in a case where the first switch is in an electrical connection state, the second switch enters an electrical disconnection state.

3. The image reading apparatus according to claim 2, wherein, in a case where the first switch is in an electrical disconnection state and the second switch is in an electrical connection state, an operation of the second reading circuit stops.

4. The image reading apparatus according to claim 1, wherein the first reading circuit electrically connects the first capacitor and the first amplifier, and further includes a third switch in an electrical connection state.

5. The image reading apparatus according to claim 1, wherein the first pixel includes
   a first inverting amplifier that is electrically connected to the first light receiving element,
   a fourth switch that is electrically connected to both terminals of the first inverting amplifier, and
   a third capacitor that is electrically connected to both terminals of the first inverting amplifier, and
wherein the second pixel includes
   a second inverting amplifier that is electrically connected to the second light receiving element,
   a fifth switch that is electrically connected to both terminals of the second inverting amplifier, and
   a fourth capacitor that is electrically connected to both terminals of the second inverting amplifier.

6. A semiconductor device comprising:
   a first pixel that includes a first light receiving element which performs photoelectric conversion;
   a second pixel that includes a second light receiving element which performs photoelectric conversion;
   a first reading circuit that includes a first capacitor which is electrically connected to the first pixel and a first amplifier having an input terminal which is electrically connected to the first capacitor;
   a second reading circuit that includes a second capacitor which is electrically connected to the second pixel, a second amplifier having an input terminal which is electrically connected to the second capacitor, and a first switch which switches whether or not to electrically connect the second capacitor to the second amplifier; and
   a second switch that switches whether or not to electrically connect a first node between the first capacitor and the first amplifier to a second node between the second capacitor and the second amplifier.

* * * * *